United States Patent
Xing et al.

(10) Patent No.: US 7,139,992 B2
(45) Date of Patent: Nov. 21, 2006

(54) SHORT PATH SEARCH USING TILES AND PIECEWISE LINEAR COST PROPAGATION

(75) Inventors: Zhaoyun Xing, San Jose, CA (US); Russell Kao, Portola Valley, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 980 days.

(21) Appl. No.: 09/998,559

(22) Filed: Nov. 30, 2001

(65) Prior Publication Data

US 2002/0107711 A1  Aug. 8, 2002

Related U.S. Application Data

(60) Provisional application No. 60/309,672, filed on Aug. 2, 2001, provisional application No. 60/250,627, filed on Dec. 1, 2000.

(51) Int. Cl.
    G06F 17/50 (2006.01)
(52) U.S. Cl. .................. 716/12; 716/4; 716/9; 716/13; 716/14
(58) Field of Classification Search .................. 716/4, 716/9, 12, 13; 370/395.52; 382/237
    See application file for complete search history.

(56) References Cited

U.S. PATENT DOCUMENTS

| | | | |
|---|---|---|---|
| 5,511,015 A | 4/1996 | Flockeneier | |
| 5,748,844 A | 5/1998 | Marks | |
| 5,838,583 A * | 11/1998 | Varadarajan et al. ........... | 716/9 |
| 5,841,664 A | 11/1998 | Cai et al. | |
| 6,175,950 B1 | 1/2001 | Scepanovic et al. | |
| 6,182,272 B1 | 1/2001 | Andreev et al. | |
| 6,230,306 B1 | 5/2001 | Raspopovic et al. | |
| 6,292,928 B1 | 9/2001 | Yamaguchi et al. | |
| 6,324,674 B1 | 11/2001 | Andreev et al. | |
| 6,324,675 B1 | 11/2001 | Dutta et al. | |
| 6,353,918 B1 | 3/2002 | Carothers et al. | |
| 6,415,427 B1 | 7/2002 | Nitta et al. | |
| 6,477,692 B1 | 11/2002 | Marchenko et al. | |
| 6,665,852 B1 * | 12/2003 | Xing et al. .................. | 716/12 |
| 6,763,512 B1 | 7/2004 | Xing | |
| 6,792,587 B1 | 9/2004 | Xing et al. | |
| 2002/0104061 A1 * | 8/2002 | Xing et al. .................. | 716/4 |

OTHER PUBLICATIONS

Sellen et al., "Direction weighted shortest path planning", May 21-27, 1995, Conference on, Digital Object Identifier 10.1109/ROBOT.525552, vol. 2, pp. 1970-1975□□.*

McAllister et al., "A compact piecewise-linear Voronoi diagram for convex sites in the plane", Nov. 3-5, 1993, Proceedings., 34th Annual Symposium on,Digital Object Identifier10.1109/SFCS.1993.366829, pp. 573-582 □□.*

(Continued)

Primary Examiner—A. M. Thompson
Assistant Examiner—Helen Rossoshek
(74) Attorney, Agent, or Firm—Zagorin O'Brien Graham LLP

(57) ABSTRACT

A method for finding shortest paths is disclosed which uses a piecewise linear cost model to guide the search of through a compact tile graph and to ensure that a shortest path may always be found in a computationally effective manner. Cost function propagation from tile segment to tile segment is used to search for a target location from a source location through a region, and the shortest path is found through tracing backwards using the cost functions calculated during the searching. Linear minimal convolution is used to facilitate the cost function propagation.

29 Claims, 17 Drawing Sheets

OTHER PUBLICATIONS

Arnold, M. H. and Scott, W. S., "An Interactive Maze Router with Hints," 25th ACM/IEEE Design Automation Conference, 1988, Paper 41.4, pp. 672-676.

Tsai, Chia-Chun et al., "An H-V Alternating Router," IEEE Transactions on Computer-Aided Design, vol. 11, No. 8, Aug. 1992, pp. 976-991.

Margarino, A. et al., "A Tile-Expansion Router," IEEE Transactions on Computer-Aided Design, vol. CAD-6, No. 4, Jul. 1987, pp. 507-517.

Liu, Le-Chin E. et al., "Chip-Level Area Routing," International Symposium on Physical Design, Proceedings of the 1998 International Symposium on Physical, Monterey, CA, 1998, ACM Press, NY, NY pp. 197-204.

Cong, Jason et al, "An Implicit Connection Graph Maze Routing Algorithm for ECO Routing," ACM SIGDA proceedings 1999, Session 3B: Routing, 5 pp.; [online] Downloaded from the Internet May 14, 2002, URL: <http://www.sigda.org/Archives/ProceedingArchives/Iccad/Iccad99/papers/1999/iccad99/pdffiles/03b_2.pdf>.

Dion, J. and Monier, L. M., "Contour: A Tile-based Gridless Router," WRL Research Report 95/3, Digital Western Research Laboratory, Palo Alto, CA, Mar. 1995, 30 pp. [online] Downloaded from the Internet May 14, 2002, URL: <ftp://gatekeeper.research.compaq.com/pub/DEC/WRL/research-reports/WRL-TR-95.3.pdf>.

Wu, Ying-Fung et al., "Rectilinear Shortest Paths and Minimum Spanning Trees in the Presence of Rectilinear Obstacles," IEEE Transactions on computers, vol. C-36, No. 3, Mar. 1987, pp. 321-331.

Zheng, S. Q. et al., "Finding Obstacle-Avoiding Shortest Paths Using Implicit Connection Graphs," IEEE Transactions on Computer-Aided Design of Integrated Circuits and Systems, vol. 15, No. 1, Jan. 1996, pp. 103-110.

* cited by examiner

SHORT PATH SEARCH USING TILES AND PIECEWISE LINEAR COST PROPAGATION

CROSS-REFERENCE TO RELATED APPLICATION(S)

This application relates to and claims priority from the following co-pending provisional patent applications:
U.S. provisional patent application Ser. No. 60/250,627, filed on Dec. 1, 2000, entitled "Minimum Cost Path Search Algorithm Through Tile Obstacles," naming Zhaoyun Xing and Russell Kao as inventors; and
U.S. provisional patent application Ser. No. 60/309,672, filed on Aug. 2, 2001, entitled "Shortest Path Search Using Tiles and Piecewise Linear Cost Propagation," naming Zhaoyun Xing and Russell Kao as inventors.

This application also relates to the following patent applications which are filed on tue same day as the present application: U.S. patent application Ser. No. 09/999,558, entitled "Piecewise Linear Cost Propagation for Path Searching," naming Zhaoyun Xing and Russell Kao as inventors, now U.S Pat. No. 6,665,852; and U.S. patent application Ser. No. 09/998,405, entitled "Systems and Method for Linear Minimal Convolution," naming Zhaoyun Xing and Russell Kao as inventors.

All of the above referenced patent applications (provisional and utility) are hereby incorporated by reference in their entirety.

BACKGROUND

1. Field

The present invention relates to path search techniques and, more particularly, to systems and methods to aid routing around obstacles such as for integrated circuit (e.g., VLSI) routing.

2. Description of the Related Art

There are many important practical applications for path searching. The classic, student's example is the traveling salesman searching for an efficient path to visit a list of locations. Some search methods are useful to plan the movement of a robot across a room around obstacles such as furniture or the movement of a robot arm through space around obstacles. One practical and currently very important engineering application of path searching is found in the semiconductor and electronics arts. Path searching and routing techniques are typically employed for layout of conductive traces. Other practical applications are well known.

The classical path searching problem and current techniques can be understood in the context of searching for a shortest path from a source point or location to a target point or location through clear space of a routing region (two-dimensional or otherwise) around various obstacles in the routing region. More specifically, assume that inside a rectangular routing region there are several rectilinear obstacles. The space not occupied by the obstacles may be called clear space. For any given two points inside the clear space, the minimum cost path search problem is to find the path with the minimum cost (e.g., the shortest path or by some other measure) inside the clear space that connects them.

Computational efficiency of path search and routing techniques is important, particularly for complex routing problems such as those presented by modern semiconductor technology and applications such as VLSI routing. Existing approaches to solving this problem typically suffer from at least one, and sometimes all of the following disadvantages: (i) complexity, (ii) overlong computational time, (iii) failure to achieve an optimal path when multiple paths exist, (iv) failure to find a path when one exists. The semiconductor routing industry, for example, is constantly looking to improve techniques for solving this problem to mitigate or eliminate the above disadvantages.

SUMMARY

A method for finding shortest paths is disclosed which uses a piecewise linear cost model to guide the search of through a tile graph and to facilitate the finding of a shortest path in a computationally effective manner. As described in further detail hereafter, the search area is fractioned into a number of tiles, each tile being defined by a set of boundary segments. Cost function propagation from tile segment to tile segment is used to search for a target location from a source location through a region, and the shortest path is found by tracing backwards using the cost functions calculated during the searching. Linear minimal convolution is used to facilitate the cost function propagation.

In an exemplary search problem, each tile in the traversable region is defined by boundary segments. The source cost function provides a cost for traversing from the source location to the boundary segment in question. The target cost function provides a cost for traversing from the boundary segment in question to the target location. In some embodiments described herein, the target cost function is estimated, and the source cost function is calculated. A path cost function is determined by adding the source and target cost functions. To facilitate the cost function calculations, multiple forms of cost function propagation between segments are disclosed.

A cost function may be propagated across tiles or cells of a clear space decomposition. For example, in a two-dimensional realization, a cost function may be propagated from one edge of a tile or cell to another, even without explicitly calculating a value for a propagation cost across the tile. In a realization suitable for rectilinear tiles described herein, techniques are provided for propagation of a piecewise linear function from one edge of a tile to (1) a parallel-oriented edge or (2) a perpendicular-oriented edge. By propagating cost functions and searching for least cost paths based on the propagated costs, some realizations in accordance with the present invention provide efficient routing or path planning. For example, a shortest path may be found using back pointers to select a the previous boundary segment on the shortest path and using the propagated cost functions to select the point at which the shortest path intersects the previous boundary segment.

For example, in VLSI design, shortest path routing solutions attempt to connect two or more geometries with a shortest possible wire length. One way to solve this problem is to use tile expansion. Non-used tiles can be stored in a data structure suitable for tile operations such as searching, tile insertion, and tile deletion. For any given pair of source and target geometries, the routing is successful if there is a sequence of clear tiles connecting them. For any given tile, there may be several neighboring tiles and an efficient search technique is important. An approach described herein employs minimum cost function propagation and propagates the minimum cost function across tiles by hopping from one piece of shared tile boundary segment to another piece of shared tile boundary segment. Based on this propagation scheme, searching methods such as A* search can be used to find the target tile. After searching, a least cost path can be traced backwards from the passing segments.

It has been further discovered that some aspects of a cost function propagation technique can be implemented using an efficient algorithm for linear minimum convolution (LMC) described herein. In general, the linear minimum convolution problem can be described as follows: assume $f(x)$ is a piecewise linear function defined over the interval, [a, b]. At any given point $(x, f(x))$, a symmetric vertical cone is attached. The area covered by all cones is open at the top and the area's boundary is a piecewise linear function that is called linear minimum convolution. A straightforward LMC implementation takes a number of steps that is quadratic in terms of number of knot points of the piecewise linear function. In contrast, the discovered techniques provide an implementation that takes a number of steps that is linear in the number of knot points. Accordingly, computational efficiency can be enhanced for realizations of the described cost function propagation technique or of realizations of path search and/or routing algorithms that employ the discovered linear minimum convolution implementation. While applications of the efficient algorithm are not limited to shortest path routing problems in VLSI, some realizations are particularly advantageous given the computational scale of such routing problems.

The foregoing is a summary and thus contains, by necessity, simplifications, generalizations and omissions of detail. Consequently, those skilled in the art will appreciate that the foregoing summary is illustrative only and that it is not intended to be in any way limiting of the invention. Other aspects, inventive features, and advantages of the present invention, as defined solely by the claims, may be apparent from the detailed description set forth below.

BRIEF DESCRIPTION OF THE DRAWINGS

The present invention may be better understood, and its numerous objects, features, and advantages made apparent to those skilled in the art by referencing the accompanying drawings (denoted "Figure" or "FIG."). The use of the same reference symbols in different drawings indicates similar or identical items.

DESCRIPTION OF THE PREFERRED EMBODIMENT(S)

The following discussion is intended to provide a detailed description of at least one example of the invention and should not be taken to be limiting of the invention itself. Rather, any number of variations may fall within the scope of the invention which is properly defined in the claims following this description.

Figure 1:
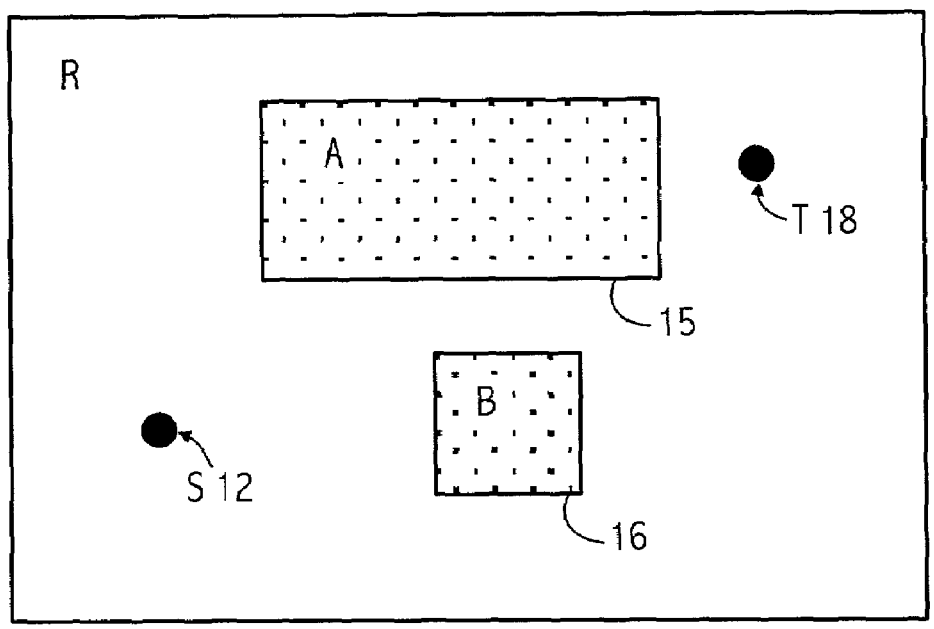
FIG. 1 is a block diagram showing an exemplary routing area.

FIG. 1 shows an example of a routing area 10 including obstacles 15 and 16 (sometimes designated "A" and "B," respectively). In the embodiment shown, the goal is to find a path from source 12 (sometimes designated "S") through the clear space of routing area 10 around obstacles 15 and 16 to target 18 (sometimes designated "T"). As used herein, the source and target are locations or end points between which a path is desired and are distinguished by an arbitrary decision to start searching for the target end point starting at the source end point. Also, during much of the following discussion, the source and target are treated as points. However, it will be understood by one of ordinary skill in the art that the source and tile may in fact be tiles (e.g., rectilinear tiles including boundary segments).

For the sake of simplicity of the following discussion and to avoid obfuscating the invention, the following description uses Manhattan paths between the source and target. That is, each path consists of an alternating sequence of vertical and horizontal line segments joined at the ends. (Other embodiments may employ other types of paths, and the basic principles described herein will apply by extension.) In the presently discussed examples, the cost of a Manhattan path is given by the weighted Manhattan distance: $c = \alpha L_H + \beta L_V$ where $L_H$ and $L_V$ are the sums of the lengths of the horizontal and vertical segments, respectively, and $\alpha \geq 0$, $\beta \geq 0$, are the horizontal and vertical weights, respectively. The weight $\alpha$ may be less than (or greater than) the weight $\beta$, for example, in order to encourage preferential routing in the horizontal (or vertical) direction. Also, $\alpha$ and $\beta$ may vary from tile to tile (defined hereafter) to discourage routing in areas that are known to be congested (for example, because of an earlier global routing analysis).

Figure 2:
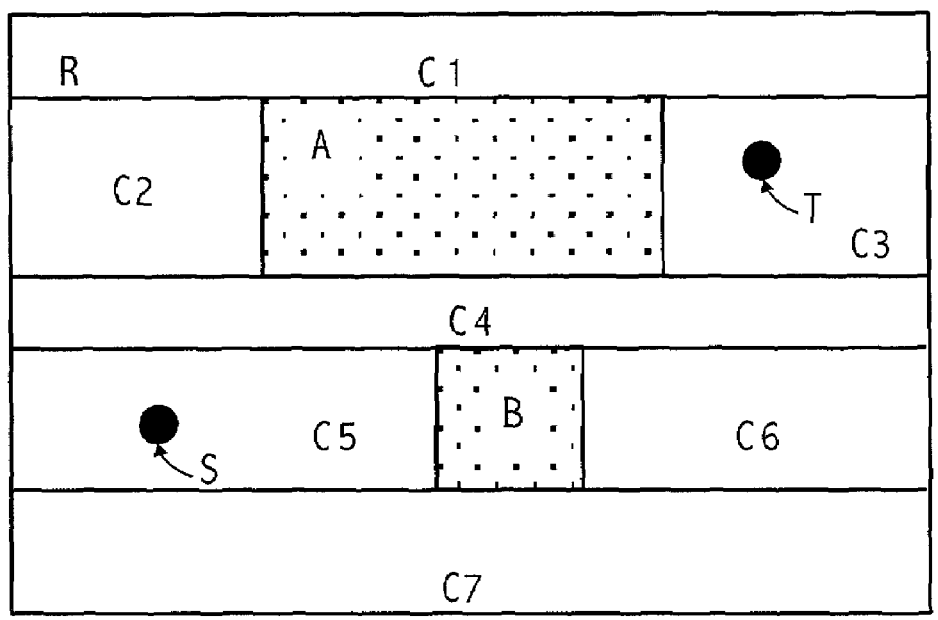
FIG. 2 is a block diagram showing an exemplary routing area fractured into tiles.
Figure 3:
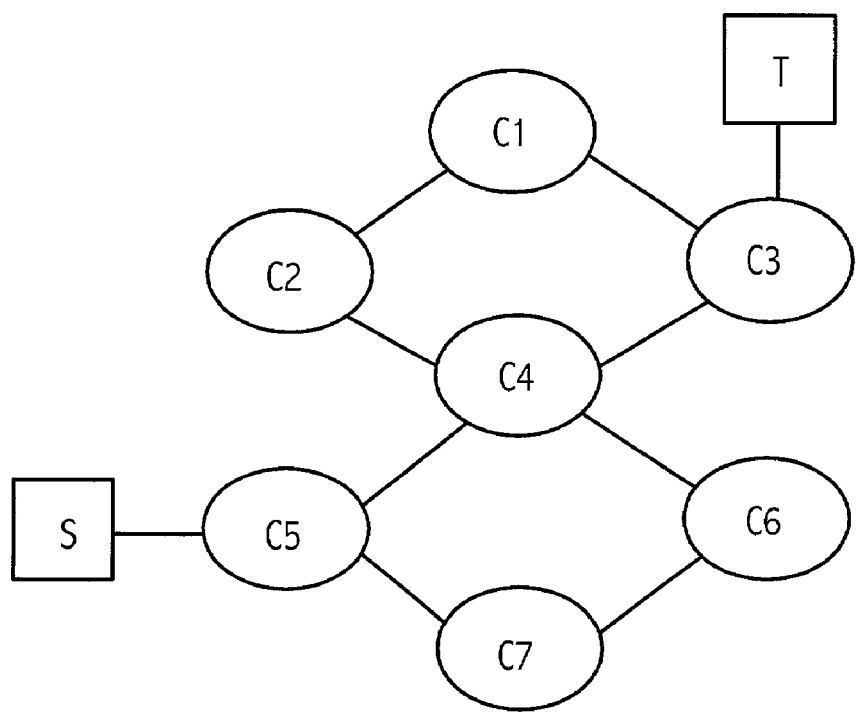
FIG. 3 is a tile graph corresponding to the routing area of FIG. 2.
Figure 5:
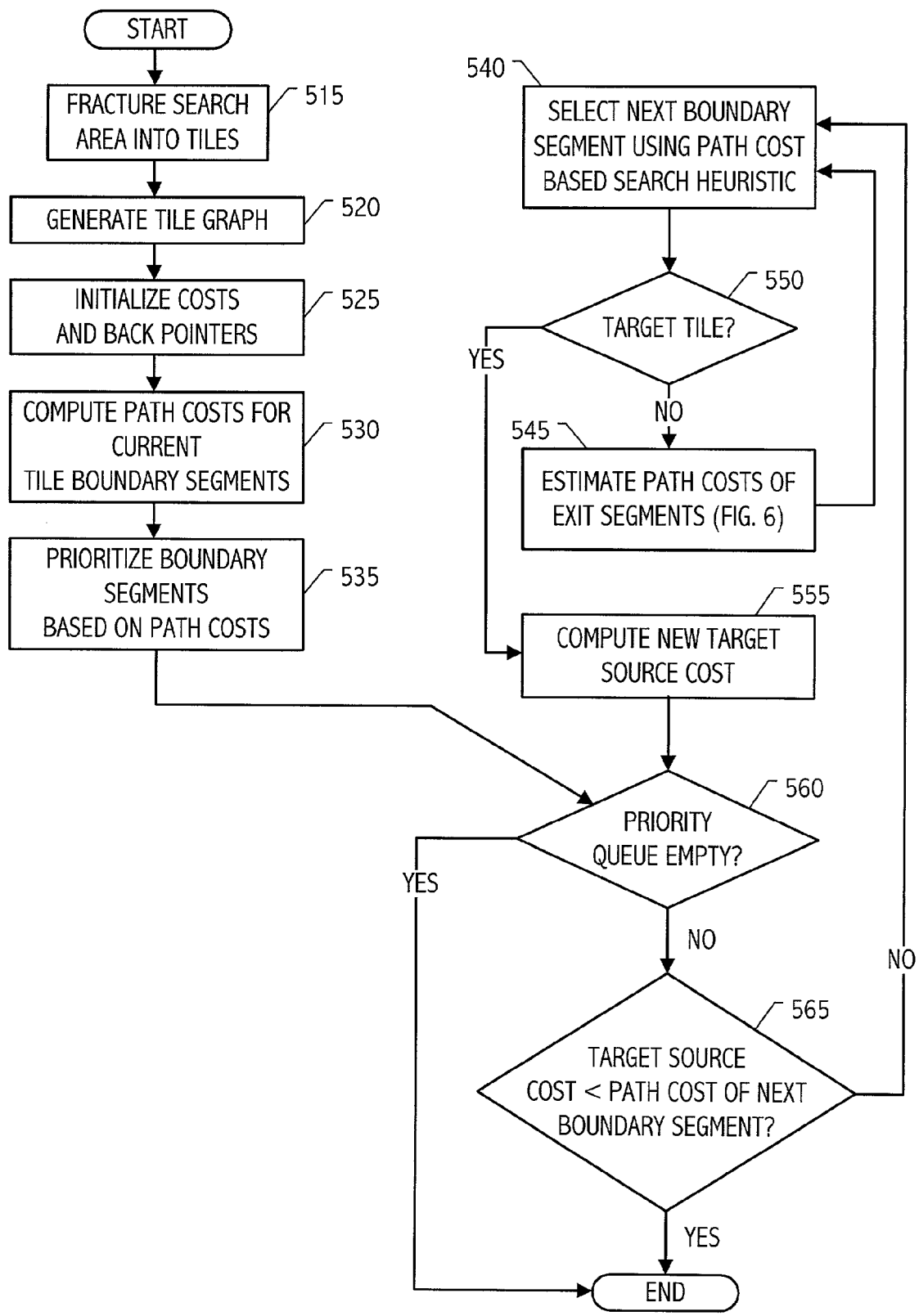
FIG. 5 is a flowchart showing a method and system for searching for a shortest path.

Referring to FIG. 5, routing begins by fracturing the unobstructed space into tiles during fracture operation 515. FIG. 2 shows exemplary routing area 10 wherein the routing region outside of obstacles A and B is fractured into seven clear tiles C1 through C7. In the present example, the tiles are rectangular. Tile C5 includes source S, and tile C3 includes target T. After routing area 10 is fractured into tiles, a tile graph is built during generate tile graph operation 520 (FIG. 5). FIG. 3 shows a tile graph 30 constructed using clear tiles C1–C7. Each clear tile is a node in tile graph 30. Whenever two clear tiles touch in FIG. 2, an edge in tile graph 30 connects their corresponding nodes. In tile graph 30, an edge connects target T and tile C3, and an edge connects source S and tile C5.

Tile graphs such as tile graph 30 are useful because they are compact. Both the number of clear tiles and the number of edges between clear tiles are linear in the number of solid tiles. This is a significant improvement over other graphing methods in which the computational features can be quadratic or geometric in the number of relevant graph features (e.g., nodes). Typically, for identical geometry, the tile graph representation is much smaller than superimposed grid techniques (uniform or non-uniform) and line probe techniques, all of which are well known in the art. At the same time, based on the teachings herein, a tile graph in accordance with the invention can be used to find the shortest path. Note that there may be multiple "shortest paths" as more than one path may have the same shortest length or cost. The embodiments described herein use an exact, piecewise linear, cost model to guide the search for the shortest path in the tile graph. This allows a much more compact graph search than past grid graphs while still finding the shortest path.

Tile graph 30 is explored beginning with the tile containing the source (tile C5 in FIG. 2 for example). The search centers on the boundaries between clear tiles. For example, it considers movement from source S to the boundary between tiles C4 and C5, or from source S to the boundary between tiles C5 and C7. These boundaries are referred to herein as boundary segments, and are noted using exemplary notation such as "boundary segment (C5, C7)." Each boundary segment is assigned an associated source cost and back pointer, both of which are described in further detail below.

Figure 4:
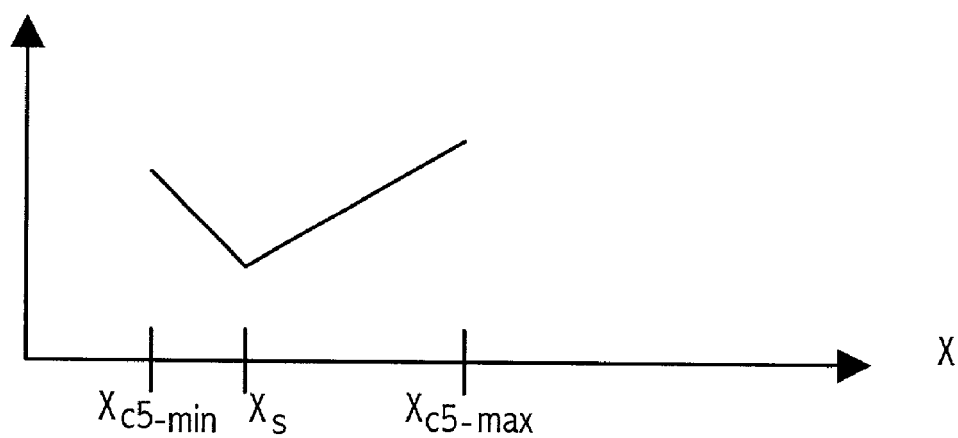
FIG. 4 is a graph of the source cost function of an exemplary tile boundary segment of FIG. 2.

For each boundary segment, a piecewise linear function is maintained to provide the cost of the shortest path (found so far) from the source to any point on that boundary segment. This cost function is referred to herein as the source cost of the boundary segment. For the present example, FIG. 4 depicts the piecewise linear source cost for boundary segment (C4, C5). In that figure, $X_{c5\text{-}min}$ and $X_{c5\text{-}max}$ are the minimum and maximum coordinates, respectively, of boundary segment (C4, C5), and $x_S$ is the x coordinate of the source point, S.

In addition to the source cost, each boundary segment is associated with at least one back pointer that facilitates the reconstruction of the shortest path. This back pointer always points to the preceding boundary segment (or to the source point, S) along the path from the source to the boundary segment in question.

As shown in FIG. 5, searching begins by initializing the costs (e.g., source and/or path costs) and back pointers of all boundary segments of the tile containing the source during initialize operation 525. In the presently discussed embodiment, the cost (e.g., the source cost) for the source is initialized to an initial value (e.g., zero) and the costs for the target (e.g., the path cost) and all boundary segments are initialized to another value (e.g., a maximal value such as infinity). In another embodiment, the source and target are rectilinear tiles, and the source tile boundary segments are assigned an initial path cost, which is the lower bound on the cost of some (yet to be discovered) path from the source to the target passing through this boundary segment.

Next, a path cost is computed for each boundary segment of the current tile during compute operation 530. The path cost is computed by first forming the sum of two piecewise linear functions: the source cost and the target cost. The source cost is defined above. The target cost gives a lower bound on the cost of a path from each point on a boundary segment to the target. The value of the target cost function at each point on the boundary segment is given by the weighted Manhattan distance between that point and the target. The weighted Manhattan distance is computed using the weights: $\alpha_{min}$ and $\beta_{min}$, given by the minimum values of $\alpha$ and $\beta$ over all clear tiles. The path cost is the minimum value of the sum of the source cost and the target cost taken at each point on the boundary segment. Calculation of an estimated target cost is discussed in greater detail below with reference at least to FIGS. 22 and 23.

Next, during prioritize operation 535, the boundary segments are prioritized. For example, a queue is maintained wherein the boundary segments are represented and ordered on the basis of such path costs. All boundary segments on the periphery of the search region are held by a priority queue.

After prioritize operation 535, the priority queue is checked during decision 560. If the priority queue is not empty, control transitions to decision 565 during which it is determined whether the target's source cost is less than the path cost of the next boundary segment in the priority queue. If the target's source cost is greater than the path cost of the next boundary segment in the priority queue, then control transitions to operation 540 and the search is continued until either the priority queue is empty at decision 560 or the target's source cost is less than the path cost of the next boundary segment in the priority queue at decision 565.

During select next boundary segment operation 540, a boundary segment is popped from the queue. The well known A* search heuristic is used to decide which boundary segment to visit next. In the presently discussed embodiment, the segment with the smallest path cost is always at the top of the priority queue. This is the segment to be visited next. In the present example, the priority queue initially holds segments (C4, C5) and (C5, C7) (see, e.g., FIGS. 3 and 7). Segment (C4, C5) is the first segment to be removed from the queue because it has the smallest path cost and is at the front of the queue. When it is removed, the search moves from the source S to segment (C4, C5).

When a boundary segment is selected as the next boundary segment using the search heuristic during select operation 540, it becomes a place of entry, the entry segment, into a new clear tile. After select operation 540, decision 550 directs a transition to compute new target source cost operation 555 if the target has been reached or to estimate path costs operation 545 if the target tile has not been reached.

During compute exit boundary segment source costs operation 545, the cost of paths from the source through the entry segment to the new tile's other boundary segments, the exit segments, are calculated. Each of exit segment may or may not be different from the entry segment. A new source cost is computed for each exit segment and compared to the source cost already stored on that segment (e.g., an initialized value of the source cost). If the newly computed source cost is less than the old source cost (at any point), then a shorter path has been found. In that case that exit segment's source cost is set to the minimum of the two source costs, the back pointer(s) is(are) updated, and the segment is entered into the priority queue at the appropriate location for future consideration.

Figure 7:
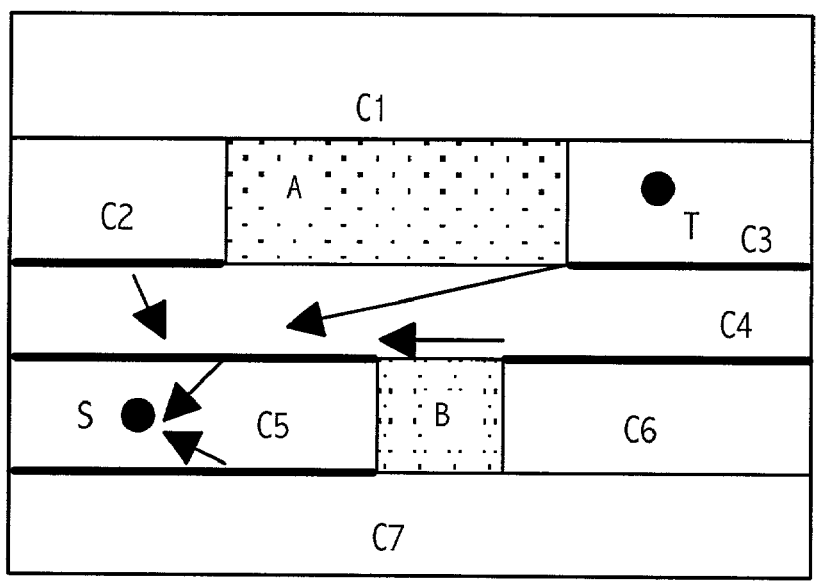
FIG. 7 is a block diagram showing the routing area of FIG. 2 with back pointers.

For example, once tile C4 is entered through entry segment (C4, C5), new source costs are computed for exit segments (C4, C2), (C4, C3), and (C4, C6) (see, e.g., FIGS. 3 and 7). Note that an entry (or exit) segment may be all or only part of a boundary segment of a tile. Since the source costs of those segments were previously initialized to an infinite value, all three segment costs are updated and entered into the priority queue, and the back pointers are updated as shown in FIG. 7. In one embodiment, the exit segment source cost is a piecewise linear function, and a scalar value (e.g., the minimum knot value) is determined for prioritization. The entry point (e.g., $x_E$) which gives the minimum source cost to the exit segment is recorded for future use during back tracking to determine the shortest path (see, e.g., discussion referring to FIG. 25).

After the exit segments for the new tile have been processed during operation 545, the next boundary segment is removed from the priority queue and the search continues recursively at operation 540. For the present example, (C4, C3) will be removed from the priority queue because it has the smallest path cost. The search process continues recursively, initially with tile C3, for example.

Figure 8:
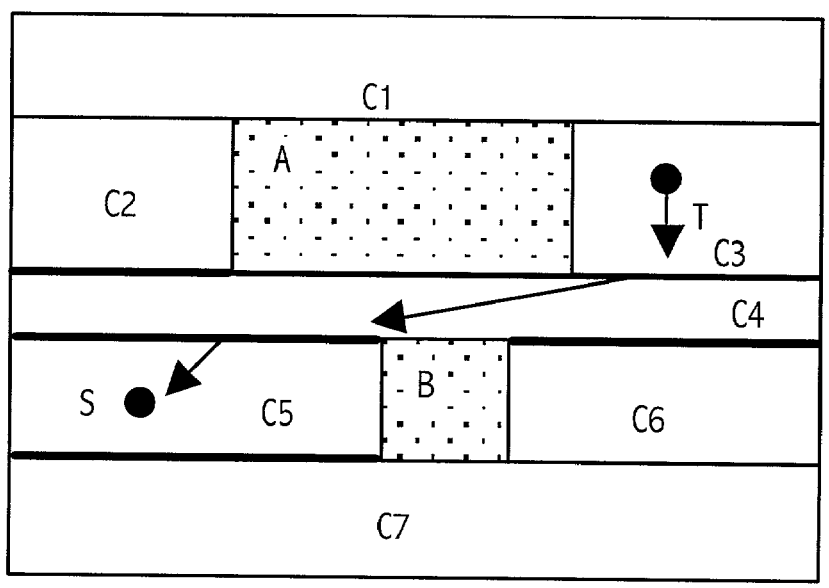
FIG. 8 is a block diagram showing the routing area of FIG. 2 with back pointers along a shortest path.

If a tile containing the target, T, is encountered at target tile decision 550, then a path has been found from the source to the target. In that case, the source cost of the entry segment is used to compute a new source cost for the target during compute new target source cost operation 555. Since the target is a point, its source cost is a scalar value. If the new source cost is lower than the target's previous source cost, then a new shortest path has been found. Control then transitions to decision 560. As discussed above, the search is continued at operation 540 unless either the priority queue is empty at decision 560 or the target's source cost is less than the path cost of the next boundary segment in the priority queue at decision 565. Upon termination due to one of those two conditions being satisfied during decisions 560 or 565, the source cost of the target gives the weighted Manhattan distance of the shortest path from S to T. The back pointer stored at the target, can be followed to retrace, in reverse order, the sequence of boundary segments visited by the shortest path, as illustrated in FIG. 8 and as discussed in greater detail below (e.g., with reference to FIG. 25, et al.). If neither condition is satisfied during decisions 560 and 565, control returns to operation 540 where the next boundary segment is selected.

The following pseudo-code provides one exemplary search algorithm which is useful in view of the teachings herein:

```
/* Initialization */
for (each boundary segment, b) {
    b->source_cost = infinity
}
for (each boundary segment, b, of the tile containing the source, S) {
    b->source_cost = cost to S
    b->back_pointer = S
    b->path_cost = minValue(b->source_cost() + target_cost())
    insert b into the priority queue based on b->path_cost
```

-continued

```
}
/* Path search */
while (true) {
    if (priority queue is empty) {return};
    b = remove from priority queue boundary segment with the smallest
path cost.
    if (b->path_cost > T->path_cost) {return};
    Use the back pointer of the boundary segment to determine which
tile we're entering.
    for (each exit segment, x) {
        Calculate a new source cost for paths through the entry segment.
        if (new source cost is less than x->source cost at any point) {
            x->source_cost = min(new source cost, x->source_cost)
            x->back_pointer = b
            x->path_cost = minValue(x->source_cost() + target_cost())
            insert x into the priority queue based on x->path_cost
        }
    }
}
```

Figure 6:
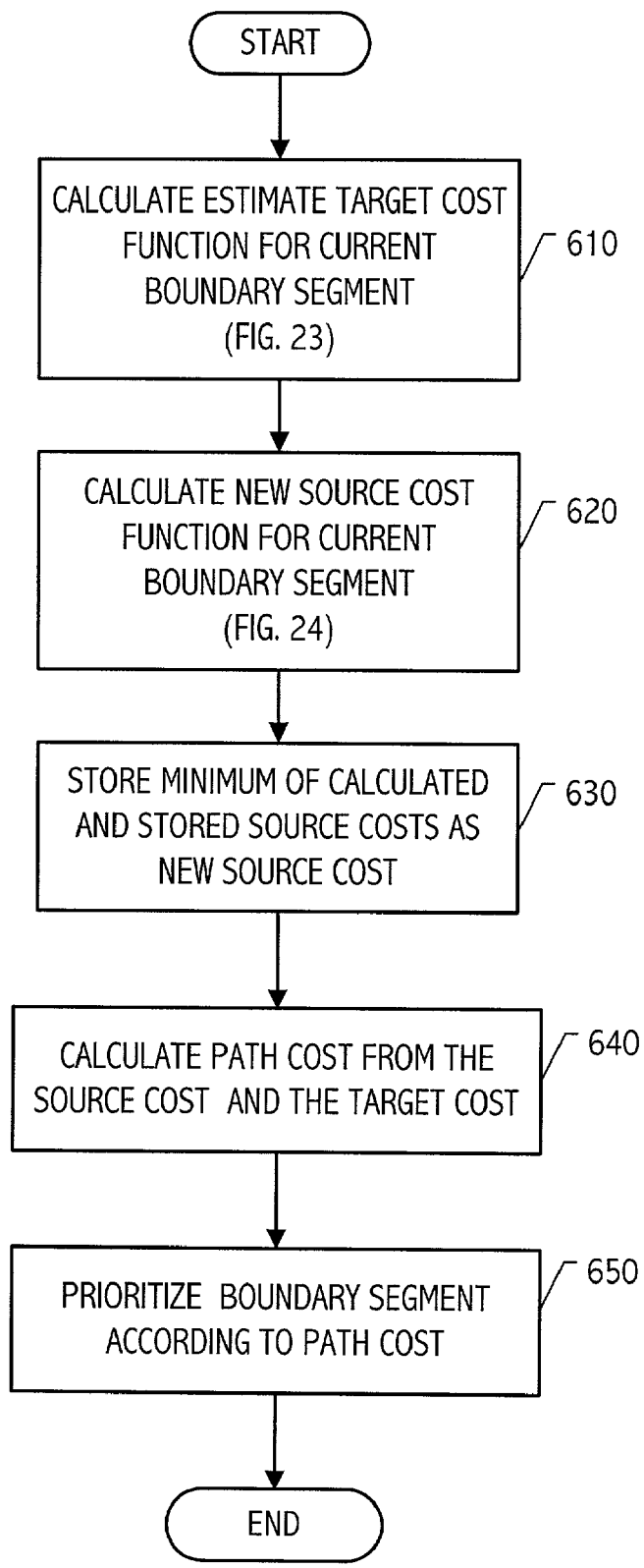
FIG. 6 is a flowchart showing a method and system for propagating cost between tile boundary segments.

As described above, when a new tile is entered via the entry segment we need to compute the cost of paths from the source through the entry segment to each of the tile's exit segments. The path cost for a boundary segment is equal to the minimum value of the sum of the source cost and the target cost taken at each point on the boundary segment. Thus, referring to FIG. 6, the value of the target cost function at each point on the next selected exit boundary segment is determined during operation 610. Next, during operation 620, a new source cost is computed for each exit segment and compared to the source cost already stored on that segment. If the newly computed source cost is less than the old source cost (at any point), that exit segment's source cost is set to the minimum of the two source costs during operation 630. Next, during operation 640, the path cost is calculated from the source and target costs. Having determined a path cost during operation 650, the segment may be entered into the priority queue at the appropriate location for future consideration.

Figure 22:
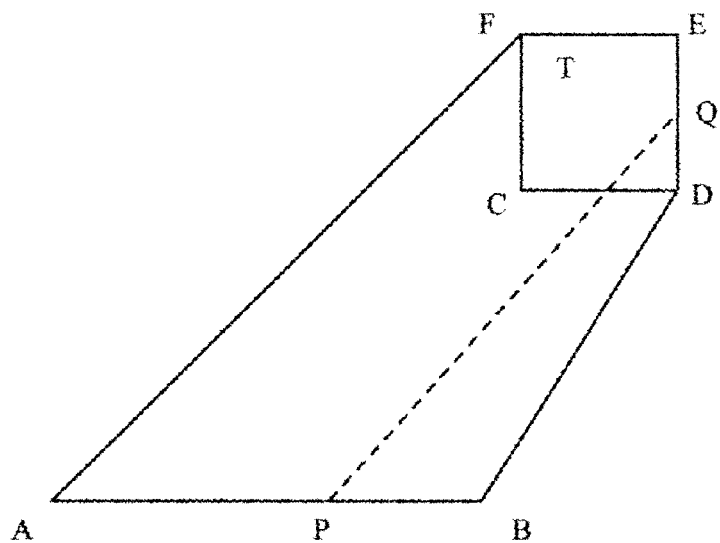
FIG. 22 is a graph showing a convex hull of a tile segment and a target tile in an exemplary routing area.

Among possible searching methods, the A* search method is attractive because it balances real cost and estimated cost. As discussed above, an estimated cost is calculated during operation 610. If the target is a point, then the estimated cost is simply a manhattan distance to the target. In the event an embodiment is used which includes a rectilinear tile target, a method of calculating the estimated cost of a segment to the destination tile T will now be discussed with reference to FIGS. 22 and 23. Referring to FIG. 22, segment AB is the segment which is the subject of target cost estimation in the presently discussed example. The vertices of target tile T are CDEF. The cost from any point on AB and any point in T is evaluated using the smallest horizontal and vertical unit cost.

Figure 23:
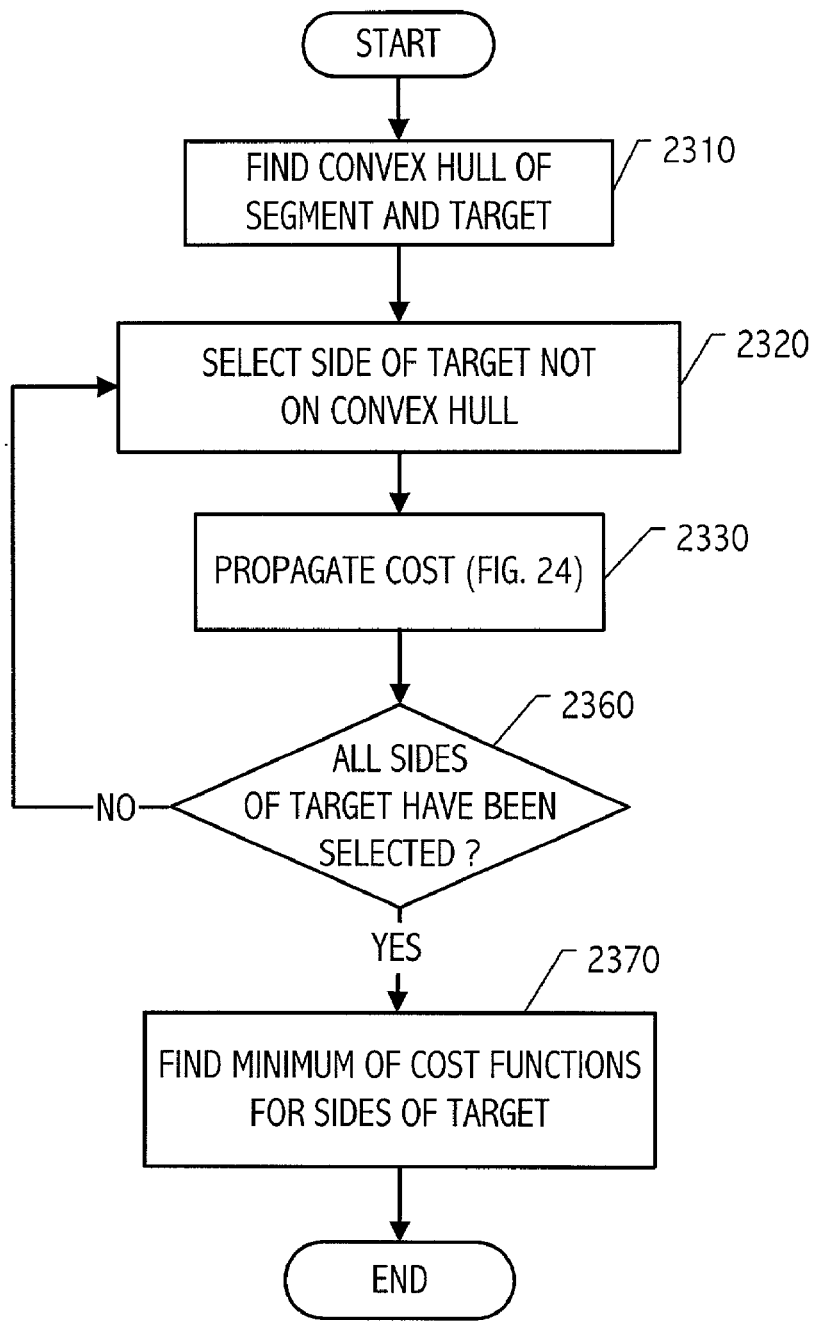
FIG. 23 is a flow chart showing an exemplary method of estimating a target cost of a tile segment.

FIG. 23 shows a method of estimating a target cost from a segment AB to a rectangular target tile T. During find hull operation 2310, the convex hull of the segment AB and the target tile T is found. Referring to FIG. 22, the convex hull containing AB and T is ABDEF.

To estimate the target cost, the minimum cost function to four sides of the target tile T can be evaluated. For example, a brute force method involves the application of the cost propagation method provided herein four times, one for each side of the target tile T.

However, at most three propagations are usually enough to find the minimum function to the four sides of T. This is because the minimum connections from some sides of T are always higher than from those of the other sides. For example, referring to FIG. 22, the line segment PQ from any point P on AB to any point Q on EF or DE will intersection with CD or FC. Thus the costs for reaching either DE or EF are always higher than those for reaching CD or FC. Therefore, it is enough to evaluate the cost propagation from AB to CD and AB to FC. Then the least cost from AB to T can be evaluated by finding the minimum of the minimum cost function on CD and FC. This result will be used to represent the estimated cost function. Accordingly, referring again to FIG. 23, after find hull operation and during select target sides operation 2320, a side of the target tile is selected which is not on the convex hull.

After select target sides operation 2320, the orientation of the segment to the selected target side is determined during decision 2330. If the selected target side is determined to be parallel to AB during decision 2330, then a method of cost propagation between parallel line segments is used to compute the minimum cost function to the target tile T during parallel cost calculation operation 2340. Alternatively, if the selected target side is determined to be perpendicular to segment AB during decision 2330, then a method of cost propagation between perpendicular line segments is used to compute the minimum cost function to the target tile T during perpendicular cost calculation operation 2350. Exemplary parallel and perpendicular cost propagation is discussed below with reference to the Linear Minimal Convolution which is introduced herein.

After either of operations 2340 and 2350, control transitions to decision 2360 which determines whether all non-hull sides of the target have been selected. If there are remaining non-hull sides of the target which have not yet been selected, control transitions to operation 2320 for selection of the next target side. If all non-hull sides of the target have been selected, the minimum function is found of all the minimum functions found during operations 2340 and 2350. The minimum estimated target cost function is returned via this method.

If the entry segment's source cost is piecewise linear then the exit segment's source cost is also piecewise linear. This propagation of costs involves a computation taught herein called the Linear Minimal Convolution (LMC) which is discussed below.

Figure 9:
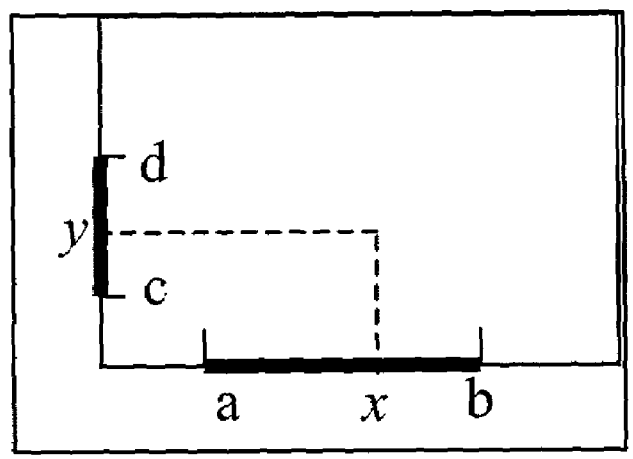
FIG. 9 shows an exemplary path and cost propagation between perpendicular boundary segments of a tile.

Let the coordinates of the bottom left and top right corners of the currently selected clear tile be: $(x_{BL},y_{BL})$, and $(x_{TR}, y_{TR})$, respectively. Let the tile's horizontal and vertical weights be $\alpha$, and $\beta$, respectively. For simplicity, the entry segment of the present discussion is assumed to be a horizontal line segment coincident with the bottom edge of the clear tile: $x \in [a,b]$, $y=y_{BL}$ as shown in FIG. 9. Let the entry segment's source cost be the piecewise linear function: $f(x)$ composed of n−1 segments. We refer to the n end points of those segments as knots: $(x_i, f(x_i))$, where $1 \leq i \leq n$, and $x_1 \leq x_2 \leq \ldots \leq x_n$. By definition, $x_1 = a$ and $x_n = b$.

Figure 24:
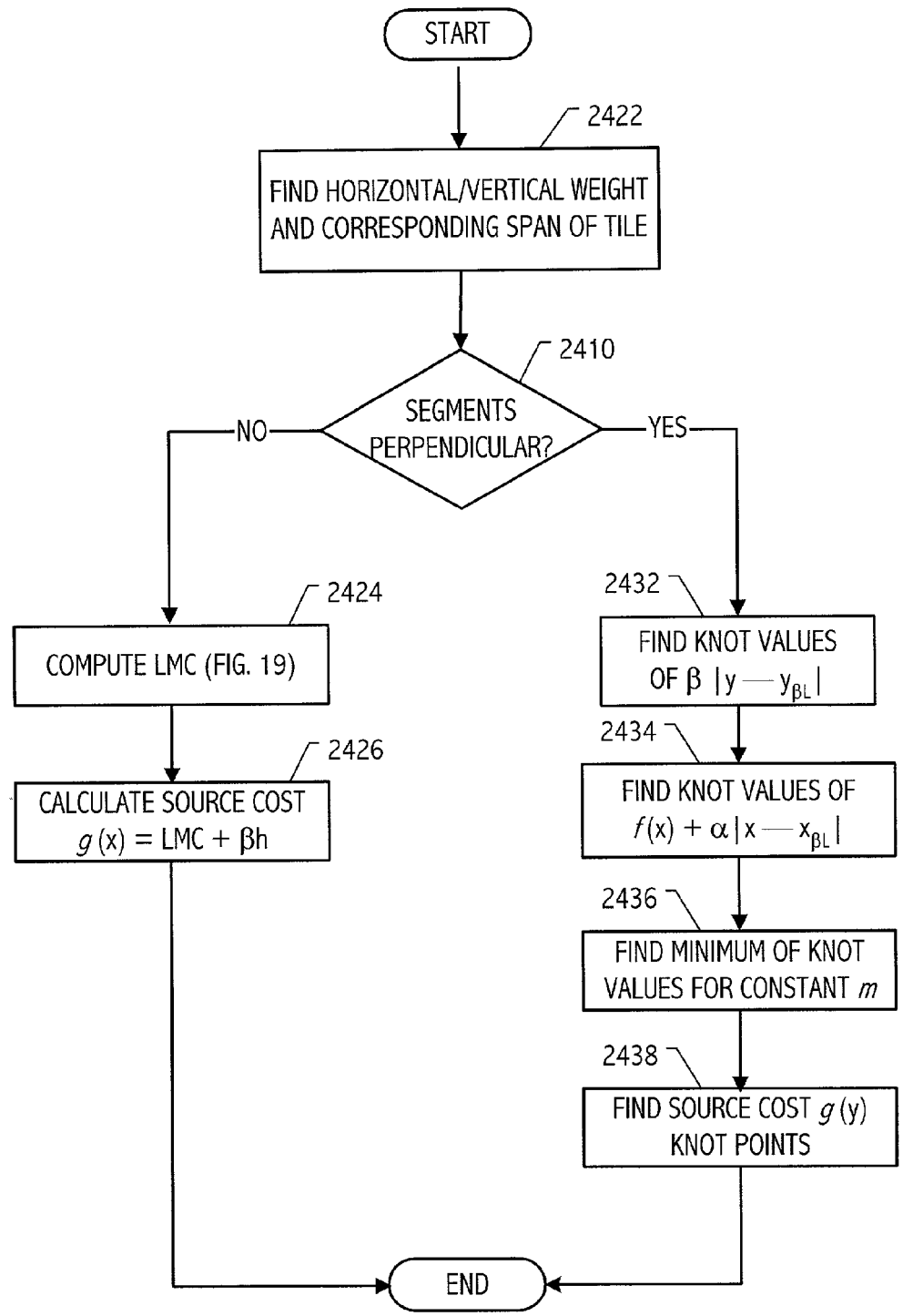
FIG. 24 is a flow chart showing an exemplary method of cost propagation.

There are two cases to consider: the entry and exit segments may be perpendicular or parallel to each other. Referring to FIG. 24, after the horizontal and vertical weight factors and the corresponding span of the tile are found during operation 2422 (discussed below), a determination is made during decision 2410 as to whether the entry and exit segments are parallel or perpendicular. If the segments are perpendicular control transitions to a set of operations 2432, 2434, 2436, 2438 which provide a method of perpendicular cost propagation, and if the segments are parallel control transitions to a set of operations 2424, 2426 which provide a method of parallel cost propagation.

For the first case in which the entry and exit segments are determined to be perpendicular to each other during operation 2410, the following discussion assumes the exit segment lies along the left edge of the clear tile: $x=x_{BL}$, $y \in [c,d]$ as shown in FIG. 9. The source cost to the exit segment may be determined by adding the source cost at the entry segment to the cost of the path from the entry segment to the exit segment (e.g., a propagation cost). However, in the present embodiment, the cost of the path from the entry segment to the exit segment is not explicitly calculated. For each point, $(x_{BL},y)$ on the exit segment, we're interested in finding the least cost path to that point over all the possible entry points that could be used to enter the tile. For the path depicted as a dashed line in FIG. 9, the source cost is given by:

$$g(y) = \min_{x \in [a,b]} \{f(x) + \alpha |x - x_{BL}| + \beta |y - y_{BL}|\}$$

$$= \beta |y - y_{BL}| + \min_{x \in [a,b]} \{f(x) + \alpha |x - x_{BL}|\}$$

$$= \beta |y - y_{BL}| + m$$

where $$m = \min_{x \in [a,b]} \{f(x) + \alpha |x - x_{BL}|\}$$

is a constant with respect to y. Referring again to FIG. 24, the knot values of the piecewise linear function $\beta|y-y_{BL}|$ are found during operation 2432. The function $p(x)=f(x)+\alpha|x-x_{BL}|$ is the sum of two piecewise linear functions and therefore is also piecewise linear. Since the minimum of a piecewise linear function must occur at one if its knots, m can be found by examining the knots of p(x) during operation 2434, and taking the minimum of such knot points during operation 2436. Thus the source cost at the exit segment, g(y) is a piecewise linear function which may be found by analyzing it's knot point(s) (e.g., 1–3 points) during operation 2438.

Figure 10:
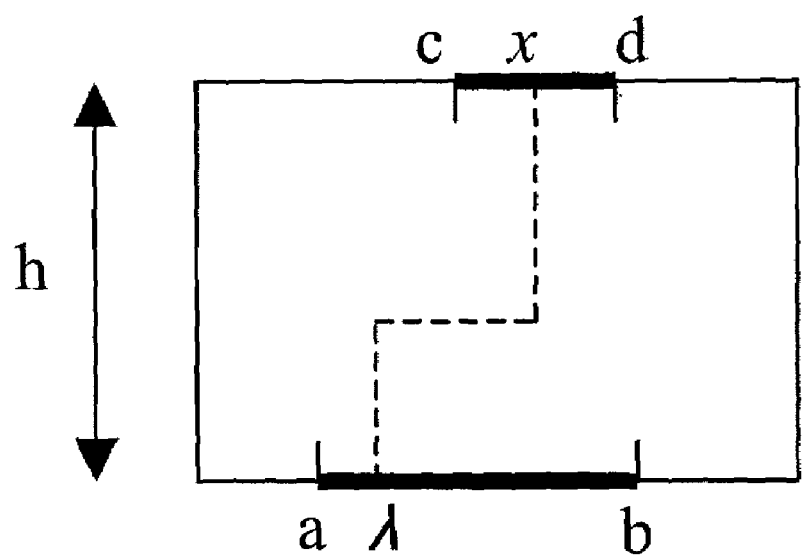
FIG. 10 shows an exemplary path and cost propagation between parallel boundary segments of a tile.

For second case in which the entry and exit segments are determined to be parallel to each other during operation 2410, the following discussion assumes an exemplary set of circumstances in which the exit segment is coincident with the top edge of the clear tile: $x \in [c,d]$, $y=y_{TR}$ as shown in FIG. 10. As before, the source cost to the exit segment is calculated by adding the source cost at the entry segment to the cost of the path from the entry segment to the exit segment. Let the vertical span or height of the clear tile be h. Then the source cost at the exit segment is given by:

$$g(x) = \min_{\lambda \in [a,b]} \{f(\lambda) + \alpha |\lambda - x|\} + \beta h$$

Figure 19:
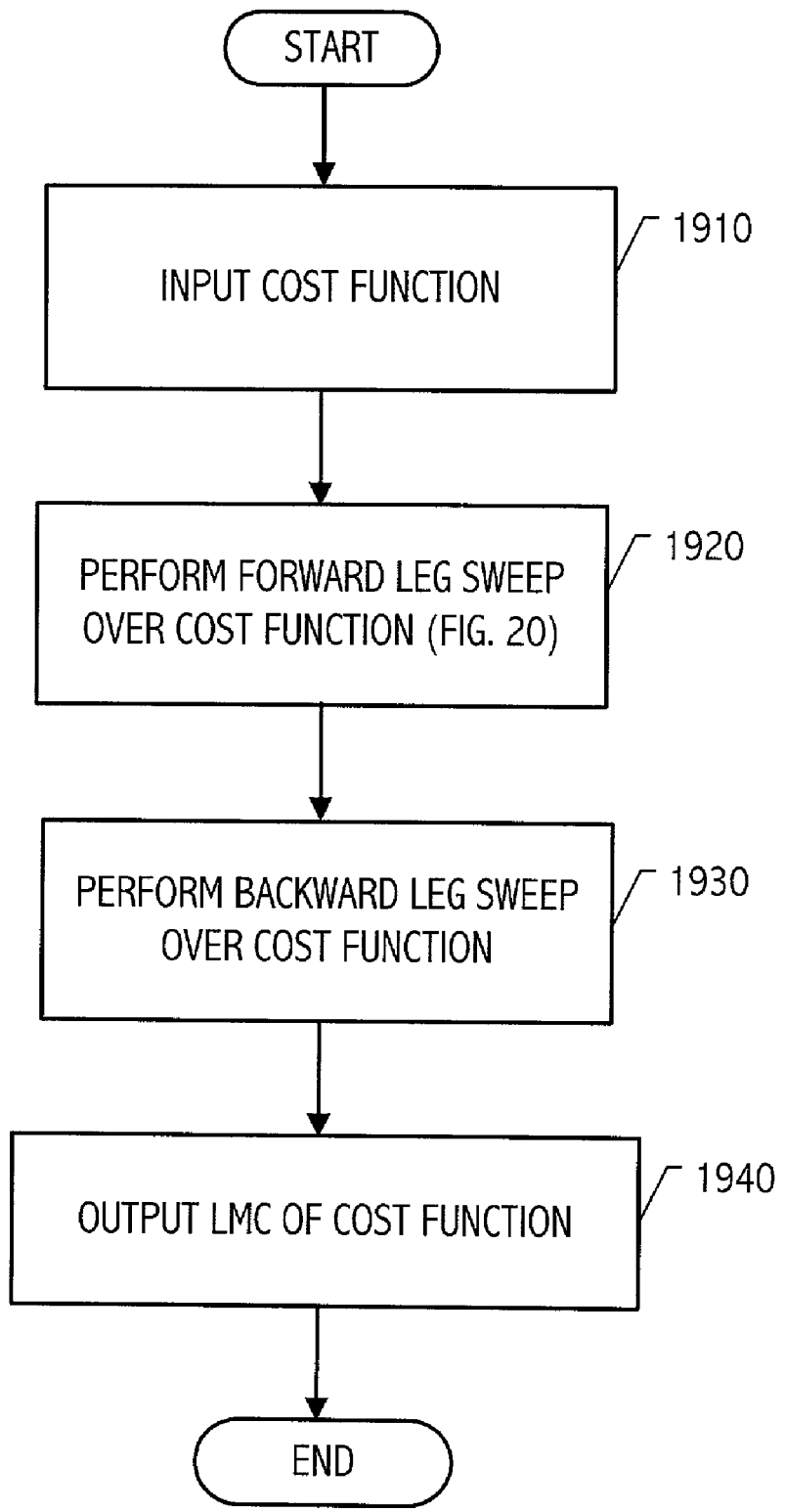
FIG. 19 is a flow chart showing an exemplary method of calculating the linear minimum convolution of a function (e.g., a cost function for VLSI routing).

Referring again to FIG. 24, the term βh is a constant determined by the vertical weight factor β and the vertical span or height h of the tile in question during operation 2422. The function $$\min_{\lambda \in [a,b]} \{f(\lambda) + \alpha |\lambda - x|\}$$

is a continuous function and can be computed during operation 2424 by a process we refer to as linear minimum convolution (LMC) which is discussed herein with reference to FIG. 19, et al. Thus, the source cost g(x) may be calculated during operation 2426 by adding the LMC output and the, βh constant.

In discussing the LMC, the notation $(\alpha * f)(x)$ is used to represent the linear minimal convolution (LMC) of a weight α (where $\alpha \leq 0$) with a function $f(x)$ (sometimes designated herein as the piecewise linear function L). Thus the LMC is defined as:

$$(\alpha * f)(x) = \min_{\lambda \in [a,b]} (f(\lambda) + \alpha|\lambda - x|)$$

Figure 11:
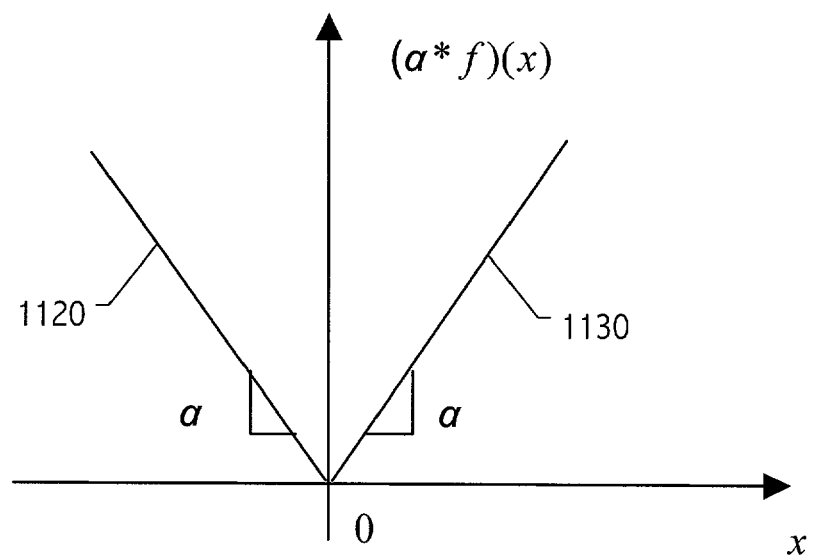
FIG. 11 is a graph showing an exemplary linear minimum convolution kernel.

Suppose $f(x)$ is defined for a single value of x:x=0, and that $f(0)=0$. Then the LMC is given by:

$$(\alpha * f)(x) = 0 + \alpha|x - 0|$$
$$= \alpha|x|$$

as shown in FIG. 11. For x>0, $(\alpha * f)(x)$ is a semi-infinite line with a slope of α. For x<0, $(\alpha * f)(x)$ is a semi-infinite line with a slope of −α. We refer to this wedge shaped function as the LMC kernel. The LMC kernel includes a forward leg 1130 which is the line with slope α, and a backward leg 1120 which is the line with slope −α.

Figure 12:
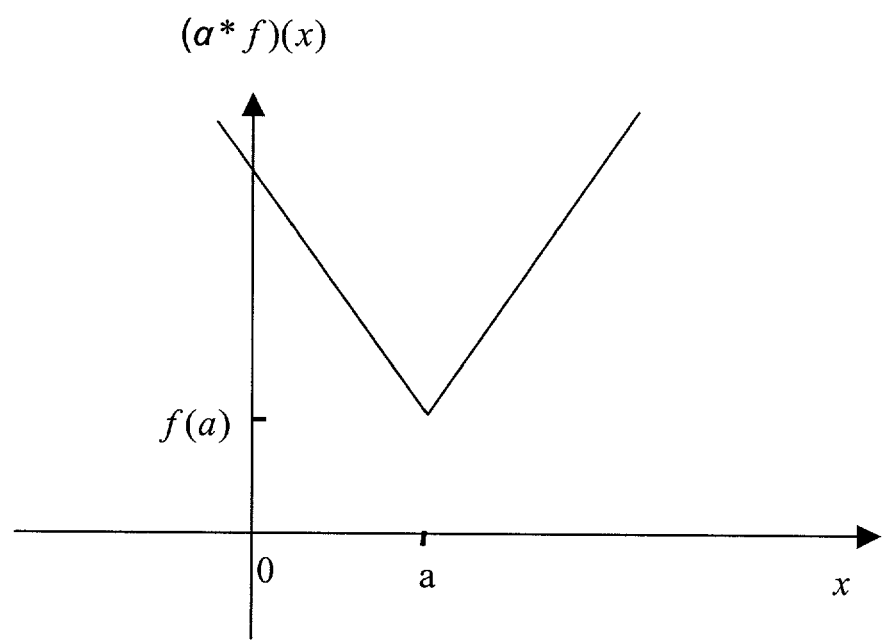
FIG. 12 is a graph showing an exemplary displaced linear minimum convolution kernel.

Next suppose that $f(x)$ is defined for a single value of x:x=a, and allow $f(\alpha)$ to be some arbitrary value. Then the LMC is given by:

$$(\alpha * f)(x) = f(\alpha) + \alpha|x - \alpha|$$

as shown in FIG. 12. This plot resembles the previous plot except that the LMC Kernel has been shifted horizontally so it is centered at x=α, and has been raised so that its minimum is $f(\alpha)$.

Figure 13:
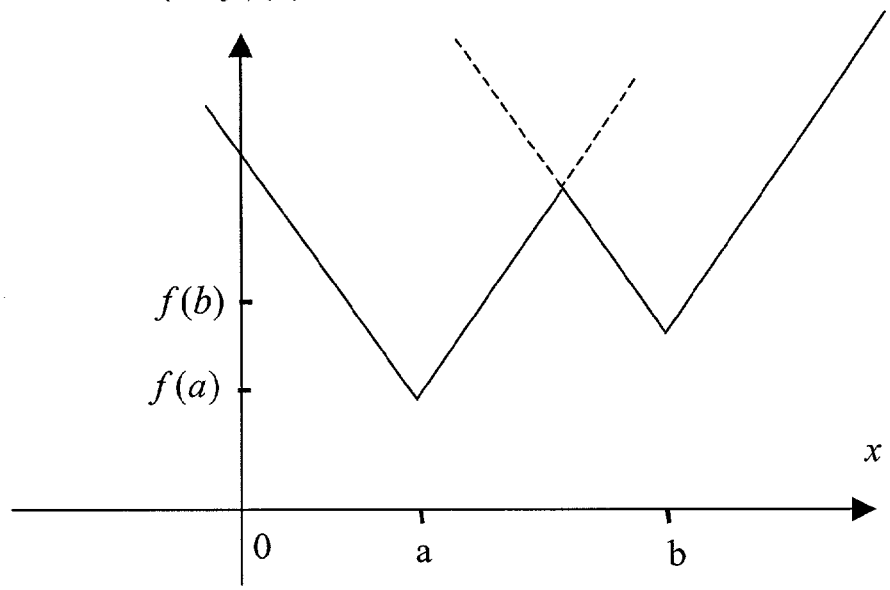
FIG. 13 is a graph showing a exemplary linear minimum convolution kernels for a function defined at two points.

Next suppose $f(x)$ is function defined for two values of x:x=α and x=β. Then the LMC is given by:

$$(\alpha * f)(x) = \min_{\lambda \in [a,b]} \{f(\lambda) + \alpha|\lambda - x|\}$$
$$= \min\{f(a) + \alpha|x - a|, f(b) + \alpha|x - b|\}$$

as shown in FIG. 13. Each value in the domain of $f(x)$ has contributed one LMC Kernel. The LMC is the minimum of all the kernels. The dashed line represents the portions of the LMC Kernels that are clipped away when the minimum is taken. Those portions don't contribute to the LMC.

Figure 14:
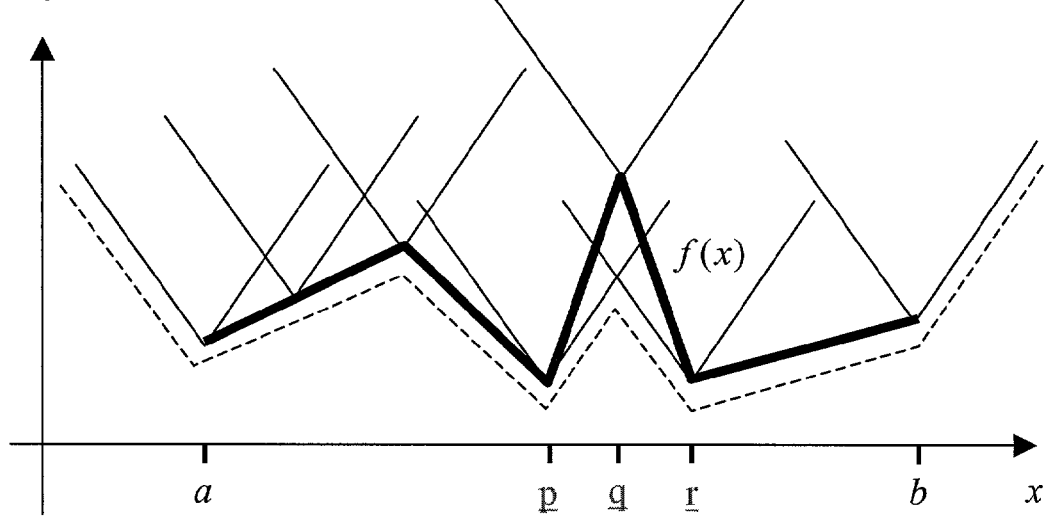
FIG. 14 is a graph showing a exemplary piecewise cost function and the linear minimum convolution corresponding thereto.

The above procedure can be applied if the domain of $f(x)$ consists of any number of values. For example, if $f(x)$ is defined over the interval [α,b] then the domain of $f(x)$ is composed of an infinite number of values. Each of those values contributes an LMC Kernel. The LMC is given by the minimum of an infinite number of LMC kernels. An example of a resulting linear minimum convolution of a piecewise linear function is FIG. 14. In FIG. 14, $f(x)$ (presumed to be piecewise linear) is plotted with a thick line. The LMC kernels, plotted with thin lines, are the wedges with vertices resting on $f(x)$. The LMC, plotted with a dashed line, is the minimum of all the LMC kernels. The LMC computation may be visualized as sliding the vertex of an LMC Kernel along $f(x)$ while tracing the envelope of all the lowest points touched by the LMC Kernel.

A number of properties are apparent from the above discussion. First, if $f(x)$ is piecewise linear then so is the LMC: $(\alpha * f)(x)$. Secondly, suppose the LMC $(\alpha * f)(x)$ is a piecewise linear function. That piecewise linear function consists of a sequence of line segments. The magnitude of the slopes of all the line segments must be less than α. The LMC operation "filters out" line segments of higher slope. Thirdly, suppose two LMC operations are performed in succession on a piecewise linear function: $(\alpha_2 * (\alpha_1 * f))(x)$. If the second LMC has a larger weight than the first: $\alpha_2 \; \alpha_1$ then the second LMC operation will have no effect: $(\alpha_2 * (\alpha_1 * f))(x) = (\alpha_1 * f)(x)$. This is true because the first LMC yields a piecewise linear function with line segments with slope magnitudes less than $\alpha_1$ (from the previous property). When an LMC kernel with steeper slopes $\alpha_2$ slides along a function with shallower slopes then no new minimums will be found. Also, displacing a function displaces its LMC as well. The LMC of a linear function is a piecewise linear function.

Figure 15:
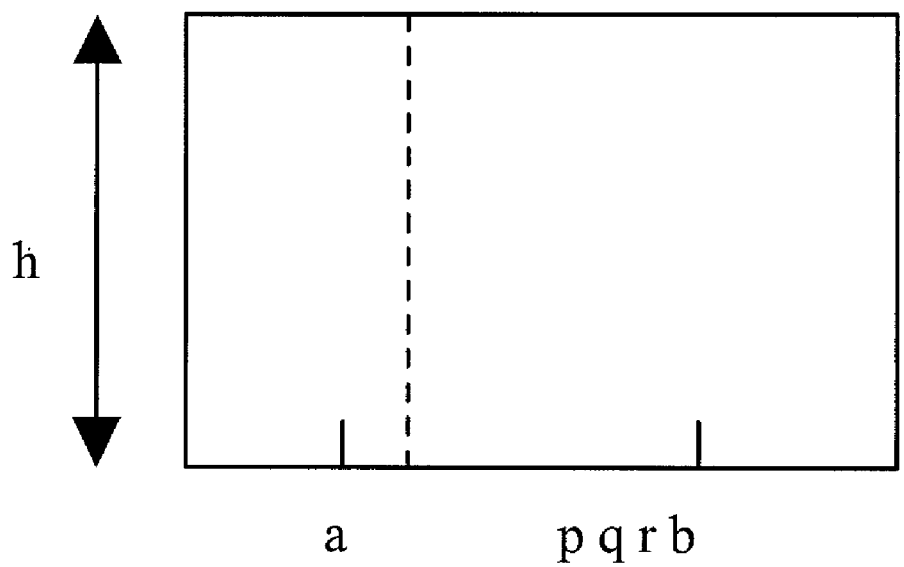
FIG. 15 is a graph showing an exemplary vertical path within a tile.

The LMC computation may be effectively used to choose paths through the tiles. As discussed above, the source cost at any point along a line a distance h away from the entry segment is the sum of two terms. (See FIG. 15 showing the choice of path in tile.)

$$g(x) = (\alpha * f)(x) + \beta h$$

The term: βh is the cost of the vertical portion of the path inside this tile. The term: $(\alpha * f)(x)$ (the LMC) is the source cost from the entry segment plus the cost of the horizontal portion of the path inside this tile.

Figure 16:
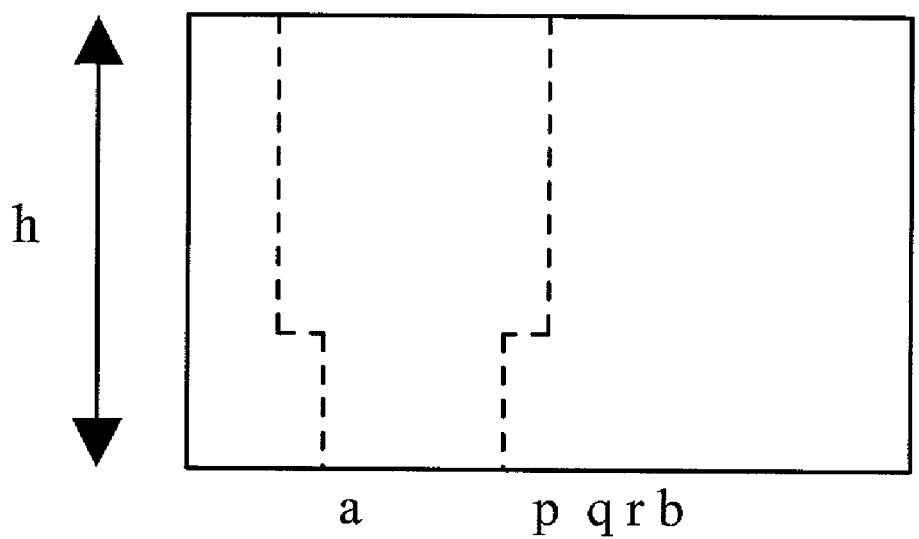
FIG. 16 is a graph showing an exemplary vertical path within a tile.

The LMC envelope is composed from two kinds of line segments: those that originate from the source cost function $f(x)$ (the thick lines in FIG. 14), and those that originate from the shifted LMC Kernel (the thin lines). Segments originating from the source cost function represent intervals over which the shortest path in this tile is entirely vertical. A typical path for the interval α x p is shown in FIG. 15 which shows vertical paths. On the other hand, segments of the LMC originating from the (shifting) LMC Kernel represent intervals over which the shortest path makes a horizontal traversal. The reason for this is that if the shifted LMC Kernel is less than a segment of the source cost then it is cheaper to shift horizontally in this tile to a cheaper point on the source cost (the vertex of the LMC kernel) than to drop down vertically. FIG. 16 shows two examples of this kind of path, one for the interval x α, and one for the interval p x q. Each has horizontal jogs. Thus implicit in the computation of the LMC is the selection of the path through the current tile. This suggests a method for reconstructing the path which is discussed in greater detail below.

The LMC of a piecewise linear function can be found by finding the minimum of the LMCs of all the functions linear segments. For example, assume $f(x)$ is piecewise linear defined as $$(x_i, f(x_i)), 0i\; n-1, a=x_0\; x_1 \ldots x_{n-1}\; x_n = b.$$

The brute force approach of finding the LMC of $f(x)$ is to compute $(\alpha * f_i)(x)$ first. Function $(\alpha * f)(x)$ can be computed by finding the minimum of all functions $(\alpha * f_i)(x)$. The fastest algorithm for finding the minimum function of two piecewise linear functions is linear in terms of n, the number of segments. Therefore, the brute force algorithm to computer LMC of $f(x)$ is quadratic in terms of number of segments.

Another method may be more preferred since it is a linear algorithm to compute the LMC of $f(x)$. For every linear segment $f(x)$, $(a * f)(x)$ has two infinite lines, a backward leg and a forward leg. The LMC of $f(x)$ can be found by clipping $f(x)$ using all the legs and saving the lower line segments. This algorithm has two sweeps: a forward clipping sweep and a backward clipping sweep.

Figure 21:
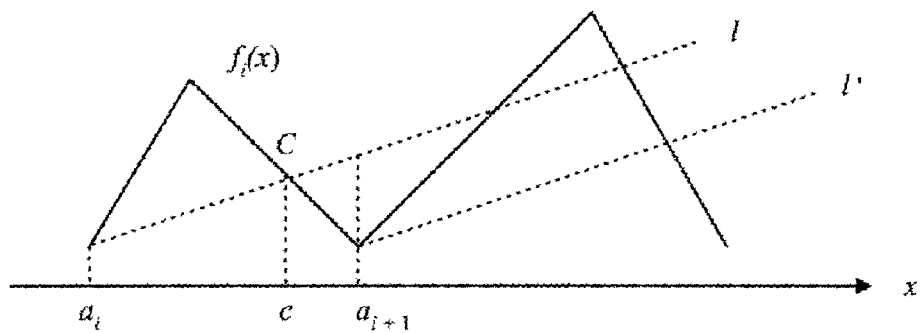
FIG. 21 is a graph showing a exemplary piecewise cost function being clipped during the forward leg sweep of FIG. 20.

As shown in FIG. 21, the forward leg l intersects $f(x)$ at C. The slope of $f_i(x)$ must be less than $\alpha$. Thus the right end point $(\alpha_{i+1}, f(\alpha_{i+1}))$ must be below line l. The forward leg l' starting from $(\alpha_{i+1}, f(\alpha_{i+1}))$ must be below l, i.e., in the interval $[\alpha_{i+1}, \infty)$ l' is lower than l. Therefore, l is no longer clipping. In the interval $[c, \alpha_{i+1}]$, $f_i(x)$ itself is lower than l. Therefore, in the remaining interval $[c, \infty)$, l is not clipping. The backward leg case can be proved the same way as the forward leg case.

FIG. 19 shows a linear running time method of finding the LMC of the piecewise linear function $f(x)$. A positive number $\alpha$ and a list L are received during input operation 1910. The list $L=\{l_0, l_1, \ldots, l_{n-1}\}$ is a sorted list of line segments that represents the continuous piecewise linear function $f(x)$ for an entry boundary segment. Next, during forward leg sweep operation 1920, a forward clipping sweep is performed on the input cost function. The forward clipping sweep is discussed in greater detail below with reference to FIG. 20. After forward leg sweep operation 1920 and during backward leg sweep operation 1930, a backward clipping sweep is performed. The backward clipping sweep is analogous to the forward clipping sweep except in the opposite direction, and is easily implemented by one of ordinary skill in the art based on the teaching herein regarding the forward clipping sweep. After backward leg sweep operation 1930 and during output operation 1940, the LMC of the cost function is output as a result from sweep operations 1920 and 1930. For example, L, the list of line segments that represents $(\alpha*f)(x)$, a continuous piecewise linear function is provided. After output operation 1940, the source cost of the exit segment may be calculated using the LMC of the entry cost function as discussed herein.

Figure 20:
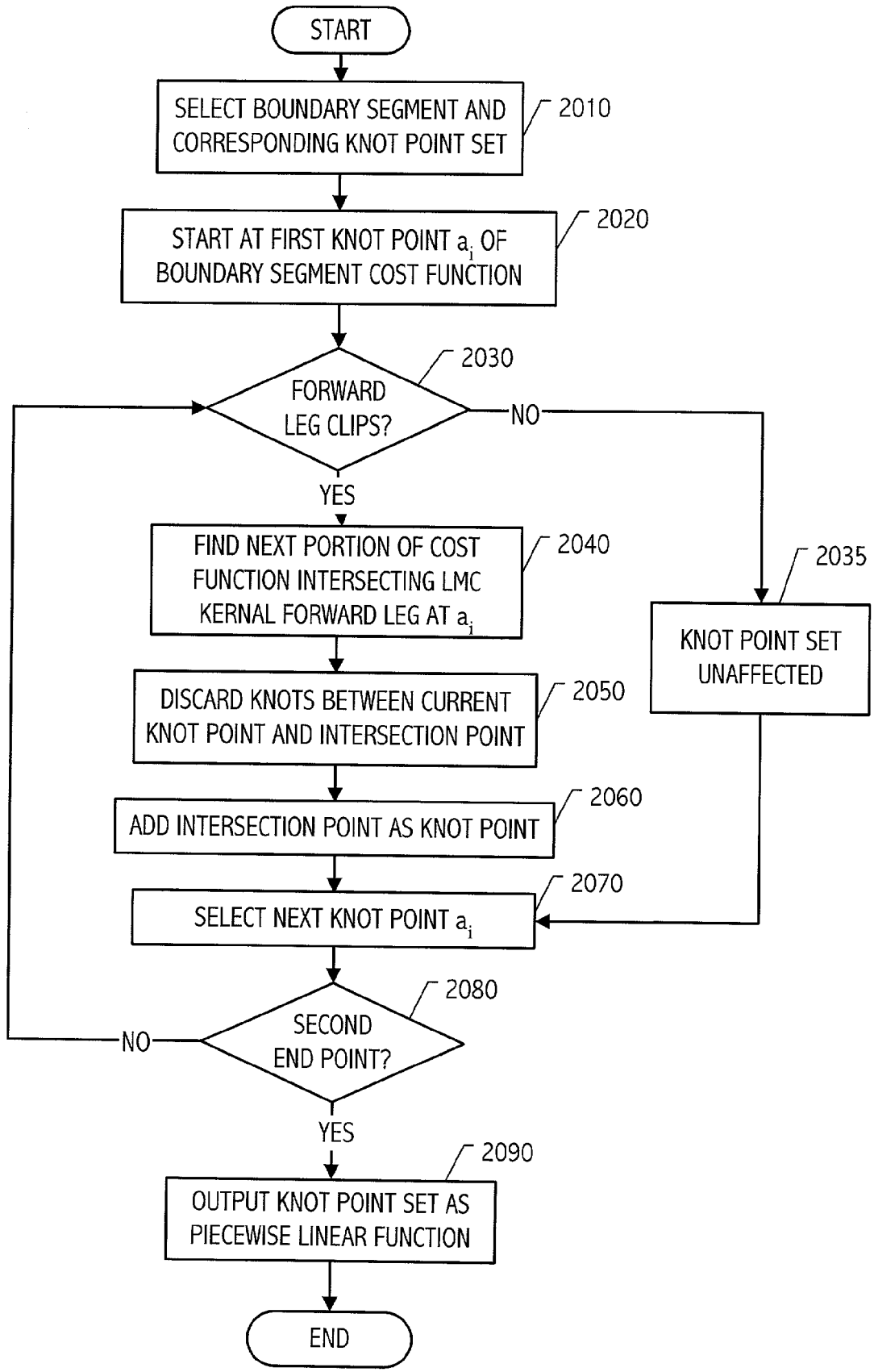
FIG. 20 is a flow chart showing an exemplary forward leg sweep of FIG. 19.

FIG. 20 shows a method of implementing a forward clipping sweep. Assuming the boundary segments are sorted (as in operation 535 of FIG. 5), the next boundary segment is selected during operation 2010 of FIG. 20. A list of knot points corresponding to the selected segment is also selected. A first point $\alpha_i$ (e.g., a first endpoint $\alpha$) of the boundary segment is selected to begin the forward sweep during operation 2020.

After operation 2020 and during clipping decision 2030, it is determined if any forward leg originating from point $\alpha_i$ (e.g., a knot of the cost function) of the boundary segment is clipping. A line segment is clipping if it intersects any piecewise linear segment of the cost function. More specifically, at any given point $\alpha_i$ not including the other endpoint b of the selected boundary segment, a forward leg starting from $(\alpha_i, f(\alpha_i))$ is clipping if the slope of $f_i(x)$ is greater than $\alpha$. When the slope of $f_i(x)$ is positive and greater than $\alpha$, the leg goes under the segment and therefore it is clipping. The LMC of $f(x)$ includes only parts of line segments of $f(x)$, forward legs and backward legs. The clipping process chops out the parts of segments that are not part of the LMC. After a clipping forward leg intersects $f(x)$, the remaining line segment is no longer clipping.

If a forward leg of $(\alpha*f)(x)$ starting at $\alpha_i$ is not clipping during clipping decision 2030, then the function $f(x)$ defines the LMC at that point during operation 2060, and control transitions to operation 2070 therefrom.

If a forward leg of $(\alpha*f)(x)$ starting at $\alpha_i$ is clipping during decision 2030, then the next linear segment $f_j(x)$ that intersects that leg is found during operation 2040. All knot points $\alpha_k, k=i, \ldots, j$ will be ignored because they will not generate any linear segments lower than the current leg. For example, during operation 2050, clipping discards such knot points from the list of knot points for the segment selected during operation 2010. After any clipped knot points are discarded, the intersection point of the segment of $f(x)$ and the forward leg is added to the list of knot points. Thus, the forward leg defines the LMC over the span of the discarded knot points. However, during a backward sweep, additional knot points may be clipped from the list of knot points corresponding to the cost function $f(x)$. Thus, in a worst case scenario, the same number of knot points remain for analysis after a sweep operation, and in better case scenarios, fewer knot points remain for analysis.

The process resumes for the next point (e.g., new $\alpha_i = \alpha_{j+1}$) during operation 2070 and continues at clipping decision 2030 until endpoint $\beta$ of the boundary segment is encountered during end decision 2070.

The backward sweep is substantially the opposite of the forward sweep, starting from endpoint b and clipping the modified piecewise linear function using all clipping backward legs. A backward leg starting from $(\alpha_i, f(\alpha_i))$ is clipping if and only if the slope of $f_{i-1}(x)$ is negative and less than $-\alpha$. After a clipping backward leg intersects $f(x)$, the remaining line segment is no longer clipping.

The following pseudo-code provides one exemplary forward leg portion of an LMC calculation method which is useful in view of the teachings herein:

1. Set index pointer p=0
2. Scan L from segment $l_p$ to the end of L to find the first segment whose slope is greater and $\alpha$. Let $l_j$ stand for that segment. If no such segment is found, return.
3. Define a forward leg: $g(x)=\alpha*(x-\alpha_j)+f(\alpha_j)$
4. Remove segments $l_j, l_{j+1}, \ldots$ from L until encountering a segment that intersects with $g(x)$. If no segment intersecting $g(x)$ is found, then go to step 10.
5. Let $l_i$ be the segment found in step 4 that intersects with $g(x)$. Let P stand for the intersection point and let R stand for the right end point of $l_i$.
6. Insert a new segment $g(x), \alpha_j < x < P_x$ into L and position j.
7. Insert into L at position j+1 a new segment, that has P as its left end point and the right end point of $l_i$ as its right end point
8. Set p=p+2
9. Go to step 2
10. Insert a new segment: $g(x), \alpha_j < x < \infty$ into L at position j. Return When the search algorithm terminates, the sequence of boundary segments visited by the shortest path are known. The shortest path may then be reconstructed from the piecewise linear source costs stored in those boundary segments. One method is to record the origin of each segment of the piecewise linear function computed by the LMC (e.g., whether it is from $f(x)$ or the LMC kernel). However, a router typically spends the bulk of its time in the search phase and this approach may slow down the search. It is more efficient to simply rerun the LMC calculation over the much smaller number of boundary segments in the back trace.

Figure 25:
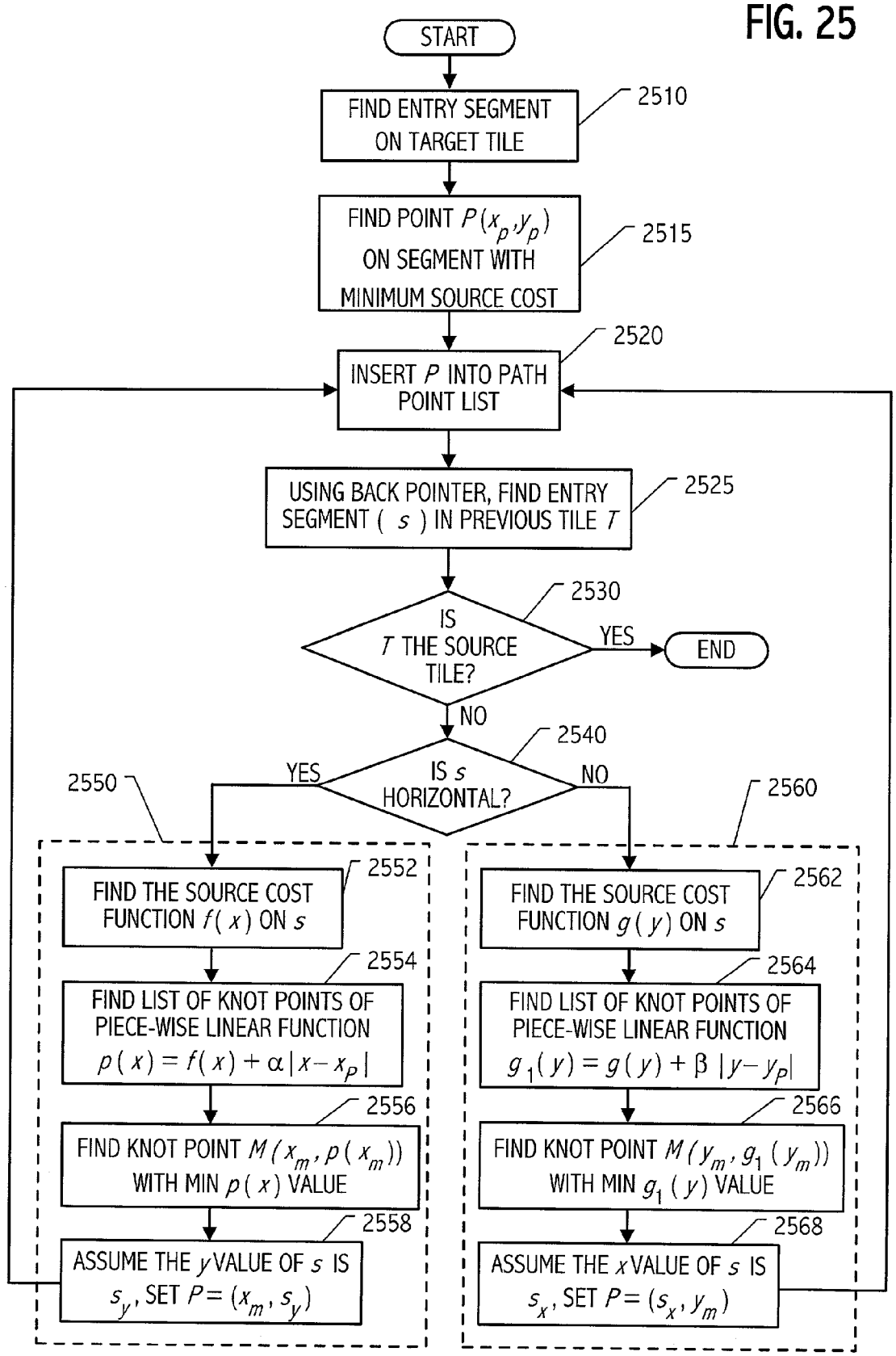
FIG. 25 is a flow chart showing an exemplary method of path reconstruction.

Path reconstruction begins with the portion of the shortest path lying within the tile containing the target (e.g., the path from the target to a point on the boundary segment found to be part of the shortest path). The back pointer in the target (e.g., represented by the arrow in FIG. 17) indicates from which boundary segment we came. Referring to FIG. 25, that entry boundary segment of the target tile is found during find target entry segment operation 2510. Next, during find minimum point operation 2515, the point $P(x_p, y_p)$ on the entry segment with the minimum source cost is found. After find minimum point operation 2515, control transitions to insert minimum point operation 2520.

During insert minimum point operation 2520, the point P($x_p$,$y_p$) is inserted into a list of points on the path from the source to the target. Next, using a back pointer, the entry segment (s) in the previous tile T is found during find previous entry segment operation 2525. After find previous entry segment operation 2525 and during source tile decision 2530, it is determined whether the source has been reached. For example, it is determined whether tile T is the source tile. If tile T is the source tile, no further back tracking need be performed because the shortest path has been found (e.g., through the list of path points). If tile T is not the source tile, control transitions to orientation decision 2540 for orientation dependent back tracing to find additional pieces of the path from the source to the target through a point on the currently selected entry segment s.

During decision 2540, it is determined if the boundary segment s on the back path from the target is horizontal or vertical. If the segment s is horizontal, then horizontal back tracing is performed during operations 2550. If the segment s is vertical, then vertical back tracing is performed during operations 2560.

The first operation of horizontal operations 2550 is find source cost function operation 2552. During find source cost operation 2552, the source cost function $f(x)$ on the segment s is found. Path reconstruction uses the equations for source cost propagation described above to find the x-value of the point P through which the shortest path intersects the segment s. However, during path reconstruction the target's position and source cost is known, and we wish to recover the point on the entry segment that gave us this minimum cost. Let the coordinates of the target be: ($x_T$,$y_T$). Then, as demonstrated above, the source cost at the target is given by:

$$C_T = \min_{x \in [a,b]} \{f(x) + \alpha |x - x_T| + \beta |y_T - y_{BL}|\}$$

$$= \beta |y_T - y_{BL}| + \min_{x \in [a,b]} \{f(x) + \alpha |x - x_T|\}$$

$$= \beta |y_T - y_{BL}| + m$$

where $$m = \min_{x \in [a,b]} \{f(x) + \alpha |x - x_T|\}.$$

The quantity inside the minimum: p(x)=$f(x)+\alpha|x-x_T|$ is piecewise linear, and is analyzed using its knot points. The knot points of the source cost function $f(x)$ and of the horizontal tile or propagation cost function $\alpha|x-x_T|$ are found during find knot points operation 2554. After find knot points operation 2554, the knot point that provides the minimum value of the sum of the source cost and propagation cost functions is found during find minimum knot point operation 2556. In this case, the x value of the knot point M on the segment s which has the minimum value for p(x) is found by examining the knots of p(x). However, rather than calculate the value of m (which is known during path reconstruction), we instead record the value of x, $x_m$, that leads to this minimum. Thus, the x value of the knot point which gives the minimum value m is recorded during operation 2556, for example. The shortest path enters this tile through the point on the entry segment: ($x_m$,$y_{BL}$). In this example, the segment is a horizontal segment at the bottom (e.g., y=$y_{BL}$) of the tile T. An analogous method may be used for calculating a horizontal segment at the top of a tile.

Figure 17:
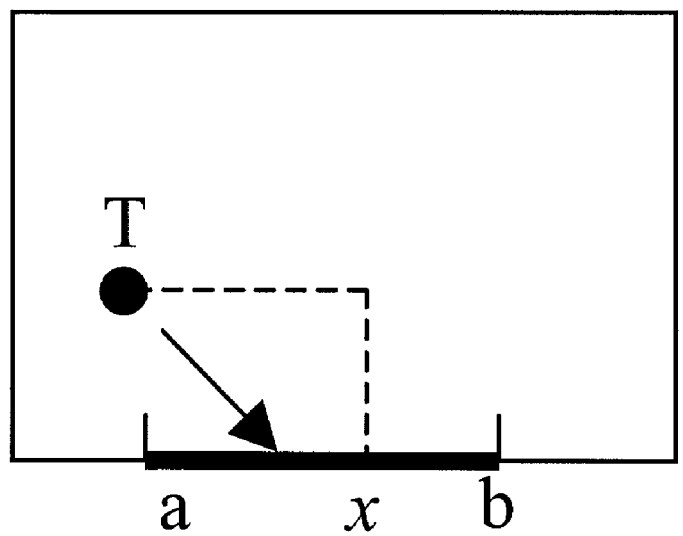
FIG. 17 is a graph showing an exemplary short path between target and boundary segment.

After the x value of the point P through which the shortest path intersects the current segment s is found, the point P may be recorded because the y value is already known. For example, when the segment is horizontal as shown in FIG. 17, the vertical or y location of the entry point is known (e.g., $y_{BL}$) since the value for y is the same for the entirety of the entry segment. Thus, the point P is determined to be ($x_m$,$s_y$) during set path point operation 2558.

Similarly, if the segments are determined to be vertical during decision 2540, the horizontal or x location of the entry point is known since the value for x is the same for the entirety of the entry segment. Path reconstruction uses the equations for source cost propagation described above to find y during operations 2560.

During find source cost operation 2562, the knot points of the source cost function are found. Next, the list of knot points of the piecewise linear function $g_1(y)=g(y)+\beta|y-y_p|$ is found during find knot points operation 2564. Next, the knot point that provides the minimum value of the function $g_1(y)$ is found during operation 2564. Next, because the x value is known when the segment s is vertical, and y value was determined during operation 2566, the point P through which the path intersects the entry segment s is set to ($s_x$,$y_m$) during set path point operation 2568.

After each of operations 2558 and 2568, control transitions to operation 2520 where the point P is inserted into the list of point points. A new entry segment is selected using back pointer(s) in subsequent operations thereafter.

Figure 18:
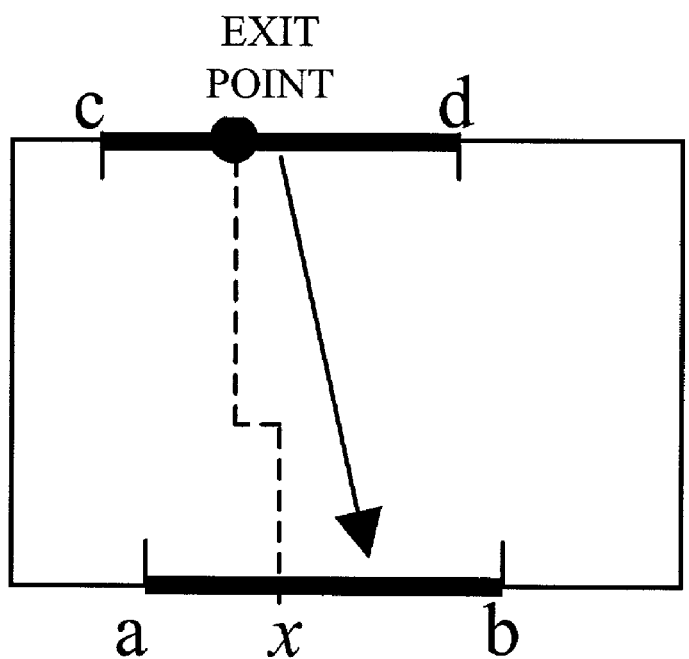
FIG. 18 is a graph showing an exemplary short path between boundary segments.

In FIG. 18, the shortest path through this tile is represented by the dashed line. Note that the shortest path may not be unique. For example, a stair case would have the same weighted Manhattan distance.

The above calculation is repeated recursively back to the source to construct the remainder of the path. The entry point for this tile becomes the exit point for the preceding tile and we repeat the calculation for the preceding boundary segment as shown in FIG. 25. Given a fixed exit point we calculate the coordinates of the entry point. When we reach the tile containing the source the recursive execution terminates after decision 2530. The complete shortest path is formed by concatenating the pieces found during the back trace.

The foregoing description sets forth a novel shortest path search algorithm based on the propagation of piecewise linear costs between the boundaries of clear tiles in a tile graph. Unlike earlier tile algorithms, the above described algorithm always finds the shortest path. Unlike the earlier non-uniform grid graph algorithms, the above described algorithm traverses the tile graph which is much smaller than a grid graph. One factor related to the efficiency of the above described algorithm is the observation that for VLSI routing examples, the number of knots in the piecewise linear costs is constant. This implies that one can traverse an edge in the tile graph in constant time.

The above description is intended to describe at least one embodiment of the invention. The above description is not intended to define the scope of the invention. Rather, the scope of the invention is defined in the claims below. Thus, other embodiments of the invention include other variations, modifications, additions, and/or improvements to the above description.

For example, those skilled in the art will recognize that boundaries between the functionality of the above described operations are merely illustrative. The functionality of multiple operations may be combined into a single operation, and/or the functionality of a single operations may be distributed in additional operations. Moreover, alternative embodiments may include multiple instances of a particular operation, and the order of operations may be altered in various other embodiments.

The operations discussed herein may consist of steps carried out by system users, hardware modules and/or software modules. In other embodiments, the operations of FIGS. 5, 6, 19, 20 and 23, for example, are directly or indirectly representative of software modules resident on a computer readable medium and/or resident within a computer system and/or transmitted to the computer system as part of a computer program product. Thus, the operations referred to herein may correspond to modules or portions of modules (e.g., software, firmware or hardware modules, or combinations thereof). The functionality of operations referred to herein may correspond to the functionality of modules or portions of modules in various embodiments.

Those skilled in the art will recognize that the boundaries between modules are merely illustrative and alternative embodiments may merge modules or impose an alternative decomposition of functionality of modules. For example, the modules discussed herein may be decomposed into submodules to be executed as multiple computer processes. Moreover, alternative embodiments may combine multiple instances of a particular module or submodule.

The above described method, the operations thereof and modules therefor may be executed on a computer system configured to execute the operations of the method and/or may be executed from computer-readable media. Computer systems may be found in many forms including but not limited to mainframes, minicomputers, servers, workstations, personal computers, notepads, personal digital assistants, various wireless devices and embedded systems, just to name a few. A typical computer system includes at least one processing unit, associated memory and a number of input/output (I/O) devices. A computer system processes information according to a program and produces resultant output information via I/O devices. A program is a list of instructions such as a particular application program and/or an operating system. A computer program is typically stored internally on computer readable storage media or transmitted to the computer system via a computer readable transmission medium. A computer process typically includes an executing (running) program or portion of a program, current program values and state information, and the resources used by the operating system to manage the execution of the process. A parent computer process may spawn other, child processes to help perform the overall functionality of the parent process. Because the parent process specifically spawns the child processes to perform a portion of the overall functionality of the parent process, the functions performed by child processes (and grandchild processes, etc.) may sometimes be described as being performed by the parent process.

Figure 26:
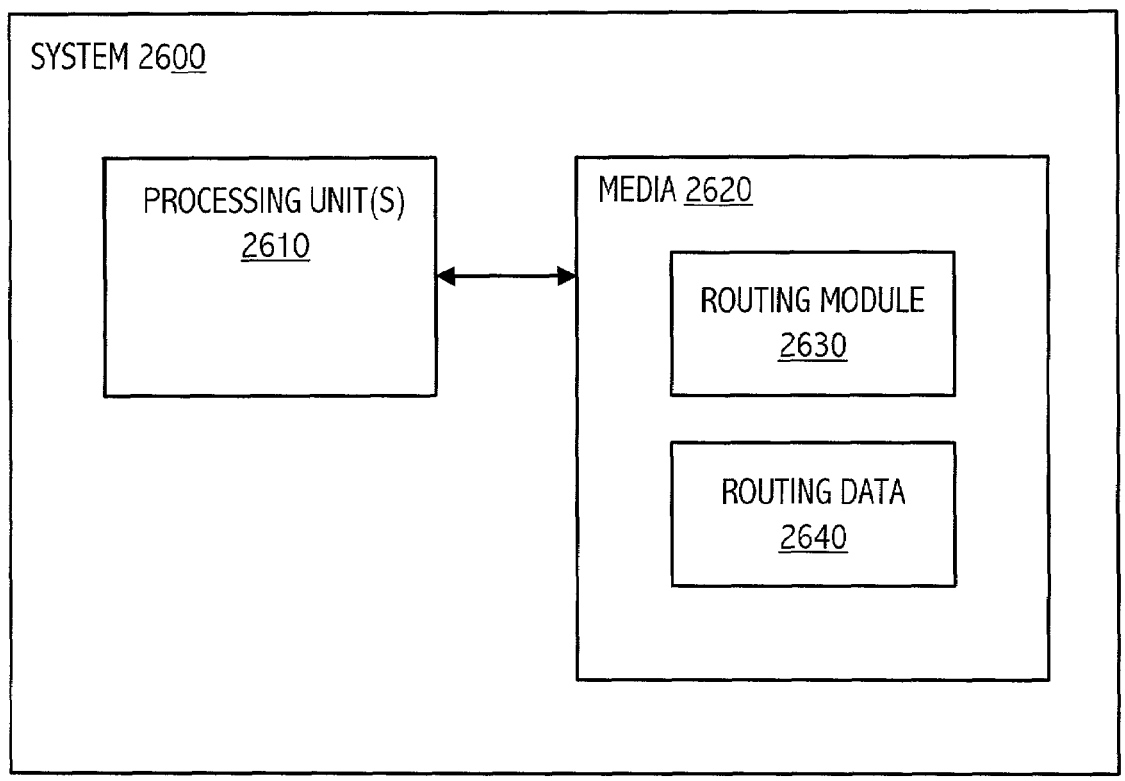
FIG. 26 is a block diagram of an exemplary system incorporating modules for use according to the present invention.

The method may be embodied in a computer-readable medium for configuring a computer system to execute the method. FIG. 26 shows an exemplary embodiment in which the software modules described above are stored within a computer system 2600 on computer readable media 2620. For example, the software modules may be stored on media 2620 as routing module(s) 2630. Routing module(s) 2630 are coupled to processing unit(s) 2610 to configure system 2600 to operate on routing data 2640. Routing data 2640 may include information pertaining to a design area, design assumptions, objects and space therein; routes and graphs related thereto, cost functions thereof, etc. Computer readable media 2620 may be permanently, removably or remotely coupled to system 2600 and/or processing unit(s) 2610. Computer readable media 2620 may include, for example and without limitation, any number of the following: magnetic storage media including disk and tape storage media; optical storage media such as compact disk media (e.g., CD-ROM, CD-R, etc.) and digital video disk storage media; holographic memory; nonvolatile memory storage media including semiconductor-based memory units such as FLASH memory, EEPROM, EPROM, ROM; ferromagnetic digital memories; volatile storage media including registers, buffers or caches, main memory, RAM, etc.; and data transmission media including permanent and intermittent computer networks, point-to-point telecommunication equipment, carrier wave transmission media, the Internet, just to name a few. Other new and various types of computer-readable media may be used to store and/or transmit the software modules discussed herein.

It is to be understood that the architectures depicted herein are merely exemplary, and that in fact many other architectures can be implemented which achieve the same functionality. In an abstract, but still definite sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected", or "operably coupled", to each other to achieve the desired functionality.

Because the above detailed description is exemplary, when "one embodiment" is described, it is an exemplary embodiment. Accordingly, the use of the word "one" in this context is not intended to indicate that one and only one embodiment may have a described feature. Rather, many other embodiments may, and often do, have the described feature of the exemplary "one embodiment." Thus, as used above, when the invention is described in the context of one embodiment, that one embodiment is one of many possible embodiments of the invention.

Notwithstanding the above caveat regarding the use of the words "one embodiment" in the detailed description, it will be understood by those within the art that if a specific number of an introduced claim element is intended in the below claims, such an intent will be explicitly recited in the claim, and in the absence of such recitation no such limitation is present or intended. For example, in the claims below, when a claim element is described as having "one" feature, it is intended that the element be limited to one and only one of the feature described. Furthermore, when a claim element is described in the claims below as including or comprising "a" feature, it is not intended that the element be limited to one and only one of the feature described. Rather, for example, the claim including "a" feature reads upon an apparatus or method including one or more of the feature in question. That is, because the apparatus or method in question includes a feature, the claim reads on the apparatus or method regardless of whether the apparatus or method includes another such similar feature. This use of the word "a" as a nonlimiting, introductory article to a feature of a claim is adopted herein by Applicants as being identical to the interpretation adopted by many courts in the past, notwithstanding any anomalous or precedential case law to the contrary that may be found. Similarly, when a claim element is described in the claims below as including or comprising an aforementioned feature (e.g., "the" feature), it is intended that the element not be limited to one and only one of the feature described merely by the incidental use of the definite article.

Furthermore, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

While particular embodiments of the present invention have been shown and described, it will be obvious to those skilled in the art that, based upon the teachings herein, various modifications, alternative constructions, and equivalents may be used without departing from the invention claimed herein. Consequently, the appended claims encompass within their scope all such changes, modifications, etc. as are within the spirit and scope of the invention. Furthermore, it is to be understood that the invention is solely defined by the appended claims. The above description is not intended to present an exhaustive list of embodiments of the invention. Unless expressly stated otherwise, each example presented herein is a nonlimiting or nonexclusive example, whether or not the terms nonlimiting, nonexclusive or similar terms are contemporaneously expressed with each example. Although an attempt has been made to outline some exemplary embodiments and exemplary variations thereto, other embodiments and/or variations are within the scope of the invention as defined in the claims below.

What is claimed is:

1. A method for finding a low cost path from a source location to a target location through a traversable region partitioned into a plurality of clear tiles, each tile being an area outlined by a plurality of boundary segments, the method comprising:
    searching for a path by propagating a cost function from at least one boundary segment in the traversable region to at least one other boundary segment;
    recording the cost function for each boundary segment to which a cost is propagated;
    backtracking from the target location to the source location using recorded cost functions for boundary segments after searching; and
    providing a shortest path from the source location to the target location after backtracking.

2. The method of claim 1 wherein the searching for the path comprises:
    propagating a source cost function from one of a plurality of boundary segments in the traversable region to at least one other of the plurality of boundary segments starting at the source location; and
    repeating the propagating the source cost function until at least one source cost for the target location is found.

3. The method of claim 1 wherein the backtracking from the target location to the source location comprises:
    selecting a previous boundary segment using a back pointer; and
    selecting a path point on the selected segment by finding a point on the selected segment which provides a minimum value of the source cost function for the boundary segment.

4. The method of claim 3 further comprising repeating the selecting the previous boundary segment and the selecting the path point until the source is reached.

5. The method of claim 4 further comprising inserting the selected path point into a list of path points each time a path point is selected.

6. The method of claim 4 wherein the shortest path from the source location to the target location is derived at least in part from a list of the selected path points, each path point having been selected from a corresponding boundary segment.

7. The method of claim 3 wherein the selecting the path point comprises:
    using a first path point selection criterion if the selected boundary segment is horizontal; and
    using a second path point selection criterion if the selected boundary segment is vertical.

8. The method of claim 3 wherein the selecting the path point comprises:
    analyzing a list of knot points on a previously recorded cost function corresponding to the selected boundary segment; and
    selecting a knot point from the list of knot points which provides a minimum source cost for the selected boundary segment.

9. The method of claim 1 wherein
    the plurality of boundary segments are prioritized based on a source cost for each boundary segment, and
    the searching for the path continues until no boundary segments have a source cost lower than a recorded source cost of a boundary segment of the target tile.

10. A method for finding a low cost path from a source location to a target location through a traversable region partitioned into a plurality of tiles, each tile being outlined by boundary segments, the method comprising the steps of:
    selecting a boundary segment having a least cost of a plurality of boundary segments, wherein the first boundary segment selected is a boundary segment on a tile of the source,
    propagating a cost from the selected boundary segment to each boundary segment sharing a tile with the selected boundary segment;
    recording the cost for each boundary segment;
    repeating the steps of selecting the boundary segment, propagating the source cost and recording the cost until a cost has been recorded for a target boundary segment; and
    backtracking from the target location to the source location using the recorded cost functions for each boundary segment.

11. The method of claim 10 wherein
    the least cost is a path cost function providing a function for a path from the source location to the target location through points on the boundary segment;
    the cost propagated from the selected boundary segment is a source cost function providing a function for a path from the source location to points on the selected boundary segment; and
    the recorded cost is a source cost function.

12. The method of claim 10 wherein the step of selecting the boundary segment having the least path cost of the plurality of boundary segments comprises:
    prioritizing boundary segments based on path costs of the boundary segments in a priority queue; and
    popping a boundary segment from the priority queue which has the least path cost of the boundary segments in the priority queue.

13. The method of claim 12 wherein the estimated target cost is a weighted Manhattan distance between the boundary segment and the target tile.

14. The method of claim 12 wherein the target location is a target tile, and the calculating the path cost of each boundary segment comprises:
    finding a convex hull containing the selected boundary segment and the target tile;

calculating a minimum cost function from the selected boundary segment to each target tile boundary segment not on the convex hull; and assigning as a path cost a minimum of the calculated minimum cost functions for the target tile boundary segments not on the convex hull.

15. The method of claim 14 wherein the calculating the minimum cost function from the selected boundary segment to each target tile boundary segment not on the convex hull comprises:

using a perpendicular-specific cost propagation algorithm for each selected boundary segment that is perpendicular to each target tile boundary segment not on the convex hull; and using a parallel-specific cost propagation algorithm for each selected boundary segment that is parallel to each target tile boundary segment not on the convex hull.

16. The method of claim 10 further comprising:

assigning initial costs to boundary segments;

calculating a path cost for each boundary segment using an estimated target cost for each tile boundary segment and one of an initial source cost for each source tile boundary segment and a propagated source cost for each source tile boundary segment; and continuously prioritizing the boundary segments based on path costs of the boundary segments.

17. The method of claim 16 further comprising:

repeating the steps of selecting the boundary segment, propagating the source cost and calculating the path cost until there are no further boundary segments to select.

18. The method of claim 16 further comprising repeating the steps of selecting the boundary segment, propagating the source cost and calculating the path cost until:

a target location boundary segment has been selected and a path cost has been calculated for the target location boundary segment; and a next selected boundary segment has a path cost greater than the path cost for the target tile boundary segment.

19. The method of claim 16 wherein the assigning of initial costs comprises:

initializing source costs of source tile boundary segments to a first initial value; and initializing costs of clear tile boundary segments and target tile boundary segments to a second initial value.

20. The method of claim 19 wherein the first initial value is zero; and the second initial value is an upper cost value.

21. A computer program product encoded in at least one computer readable medium for finding a low cost path from a source location to a target location through a traversable region partitioned into a plurality of clear tiles, each tile being an area outlined by a plurality of boundary segments, the product comprising:

a first software module, executable by an information processing system, for searching for a path by propagating a cost function from at least one boundary segment in the traversable region to at least one other boundary segment;

a second software module, executable by an information processing system, for recording the cost function for each boundary segment to which a cost is propagated; and a third software module, executable by an information processing system, for backtracking from the target location to the source location using recorded cost functions for boundary segments; and a fourth software module, executable by an information processing system, for providing a shortest path from the source location to the target location after execution of the third software module.

22. The product of claim 21 wherein the first software module comprises:

at least one instruction for propagating a source cost function from one of a plurality of boundary segments in the traversable region to at least one other of the plurality of boundary segments starting at the source location; and at least one instruction for repeatedly executing the instructions for propagating the source cost function until at least one source cost for the target location is found.

23. The product of claim 21 wherein the third software module comprises:

at least one instruction for selecting a previous boundary segment using a back pointer; and at least one instruction for selecting a path point on the selected segment by finding a point on the selected segment which provides a minimum value of the source cost function for the boundary segment.

24. The product of claim 23 further comprising at least one instruction for repeating the selecting the previous boundary segment and the selecting the path point until the source is reached.

25. The product of claim 23 wherein the at least one instruction for selecting the path point comprises:

at least one instruction for using a first path point selection criterion if the selected boundary segment is horizontal; and at least one instruction for using a second path point selection criterion if the selected boundary segment is vertical.

26. The product of claim 23 wherein the at least one instruction for selecting the path point comprises:

at least one instruction for analyzing a list of knot points on a previously recorded cost function corresponding to the selected boundary segment; and at least one instruction for selecting a knot point from the list of knot points which provides a minimum source cost for the selected boundary segment.

27. The product of claim 21 further comprising:

at least one instruction for prioritizing the plurality of boundary segments based on a source cost for each boundary segment; and at least one instruction for the searching for the path until no boundary segments have a source cost lower than a recorded source cost of a boundary segment of the target tile.

28. The product of claim 21 wherein the at least one computer readable medium comprises at least one of a data storage medium and a data transmission medium, the data storage medium including at least one of the group consisting of a disk, tape, a compact disc and a digital video disc, and the data transmission medium including at least one of the group consisting of the Internet, a wireline or telecommunications network, and a wireless network.

29. The product of claim 21 embodied with an information processing system including a processor coupled to the at least one computer readable medium wherein the processor is configured to execute instructions encoded on the computer readable medium.

* * * * *